United States Patent
Nakamura et al.

(10) Patent No.: US 8,724,391 B2
(45) Date of Patent: May 13, 2014

(54) SEMICONDUCTOR MEMORY DEVICE

(75) Inventors: Dai Nakamura, Fujisawa (JP); Koji Hosono, Fujisawa (JP); Hidehiro Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 13/423,610

(22) Filed: Mar. 19, 2012

(65) Prior Publication Data

US 2013/0083597 A1  Apr. 4, 2013

(30) Foreign Application Priority Data

Oct. 3, 2011 (JP) .................................. 2011-219265

(51) Int. Cl.
*G11C 16/04* (2006.01)
(52) U.S. Cl.
USPC .................................. 365/185.17; 365/185.2
(58) Field of Classification Search
USPC .............................. 365/185.17, 185.2, 185.11
See application file for complete search history.

(56) References Cited

U.S. PATENT DOCUMENTS

| 7,430,138 | B2 | 9/2008 | Higashitani |
| 2009/0323416 | A1* | 12/2009 | Takeuchi et al. ......... 365/185.03 |
| 2010/0172189 | A1 | 7/2010 | Itagaki et al. |
| 2010/0238732 | A1 | 9/2010 | Hishida et al. |
| 2010/0277977 | A1 | 11/2010 | Nakamura |
| 2010/0329017 | A1 | 12/2010 | Nakano et al. |

FOREIGN PATENT DOCUMENTS

| JP | 2010-161199 | 7/2010 |
| JP | 2010-262696 | 11/2010 |

* cited by examiner

*Primary Examiner* — Huan Hoang
(74) *Attorney, Agent, or Firm* — Oblon, Spivak, McClelland, Maier & Neustadt, L.L.P.

(57) ABSTRACT

According to one embodiment, a semiconductor memory device includes first and second select transistors, memory cells, a driver circuit, first transfer transistors, and a detection circuit. The memory cells are stacked above a semiconductor substrate. The driver circuit outputs a first voltage. The first transfer transistors transfer the first voltage to associated word lines and select gate lines. In data erase, the detection circuit detects a second voltage applied to bit lines and/or a source line and generates a flag in accordance with the detection result. The driver circuit changes the value of the first voltage in response to the flag to cut off the first transfer transistors.

17 Claims, 19 Drawing Sheets

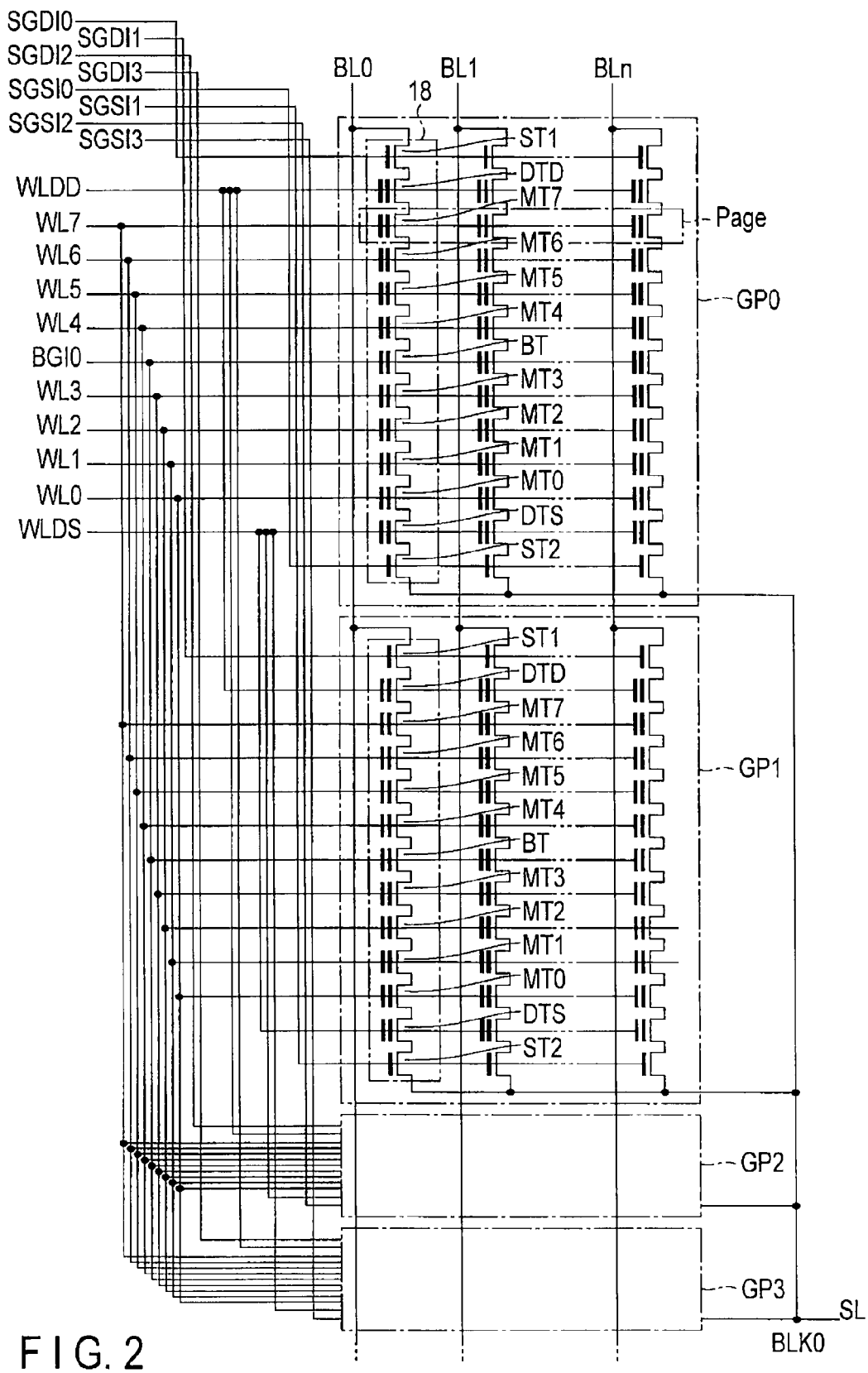
F I G. 2

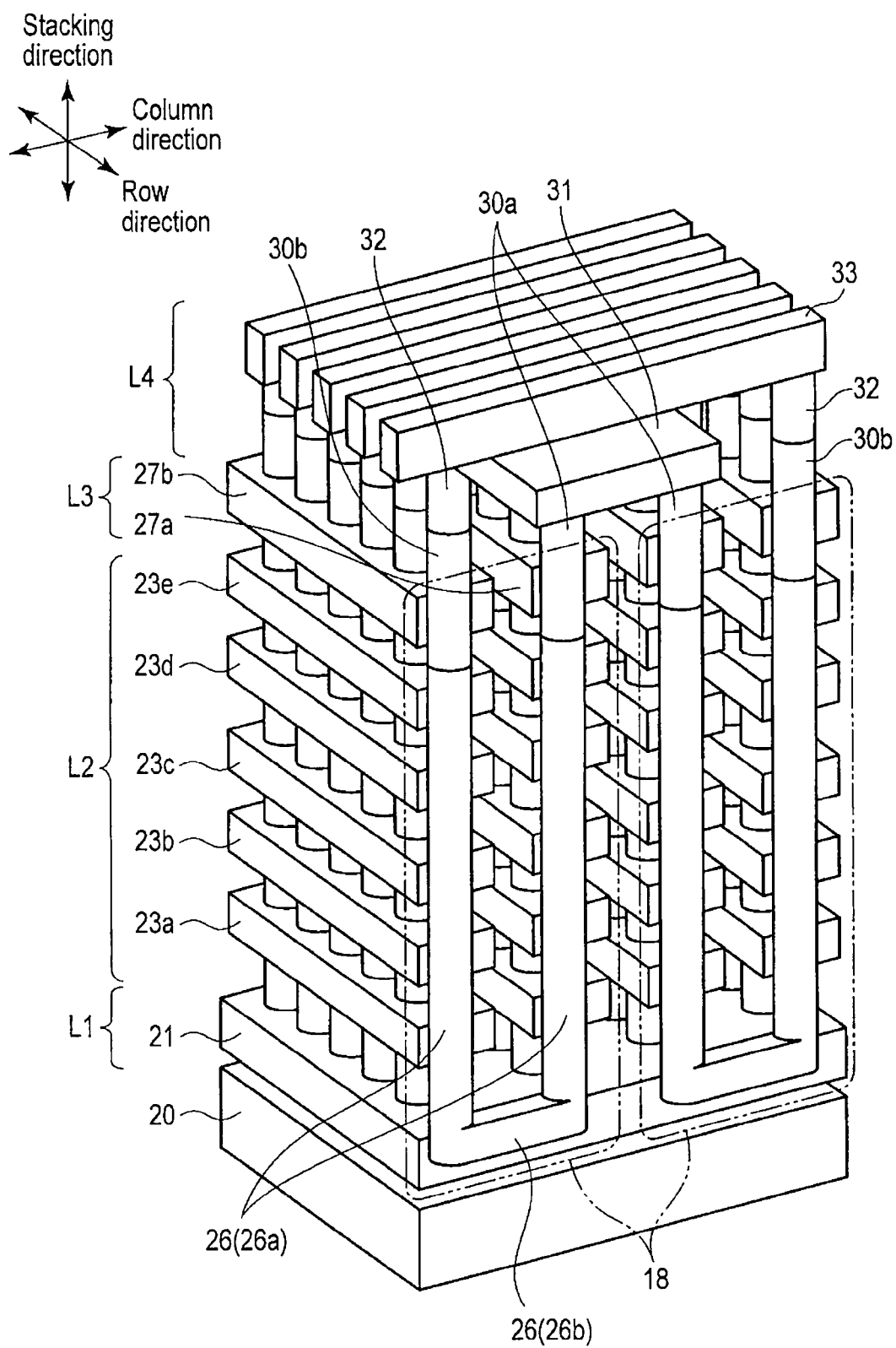
F I G. 3

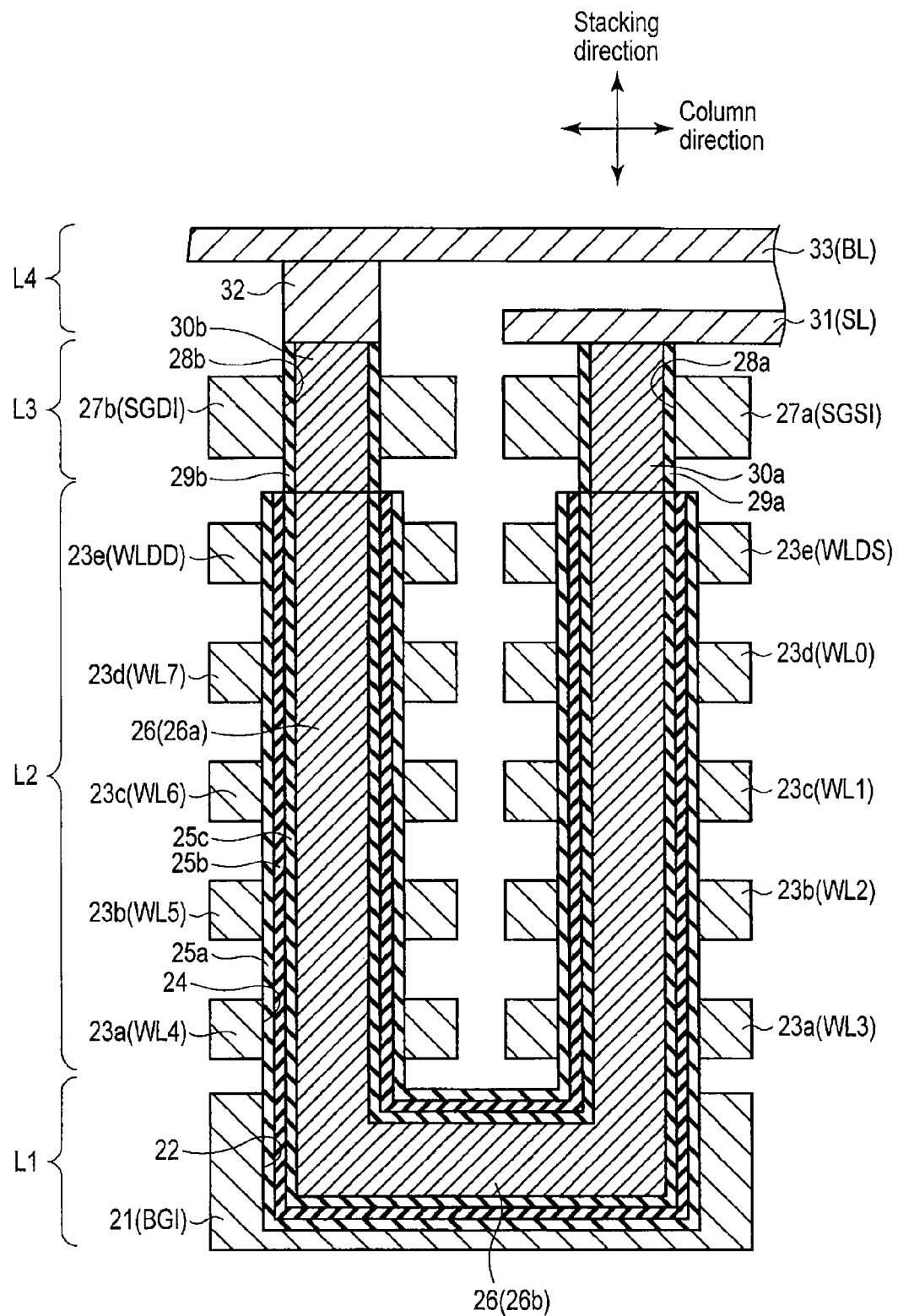
F I G. 4

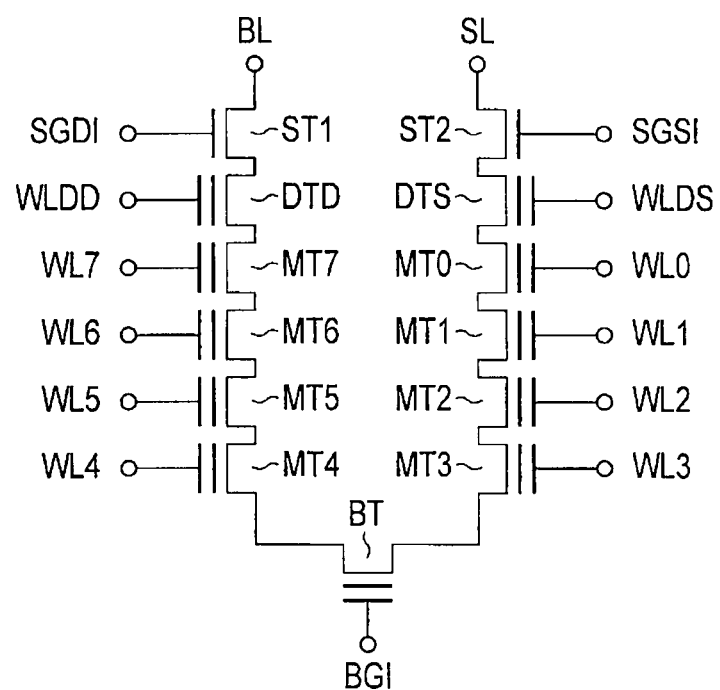
F I G. 5

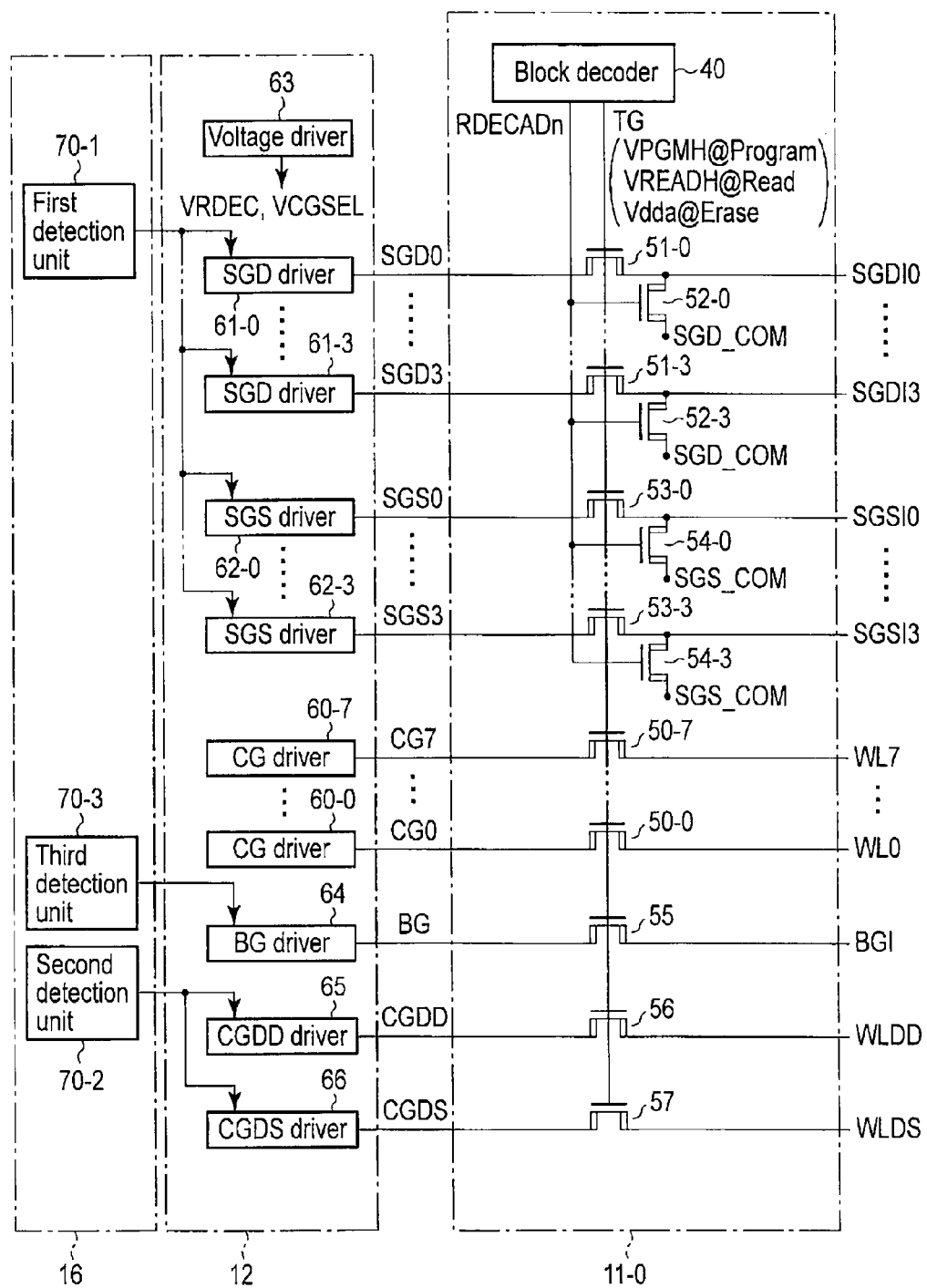
F I G. 6

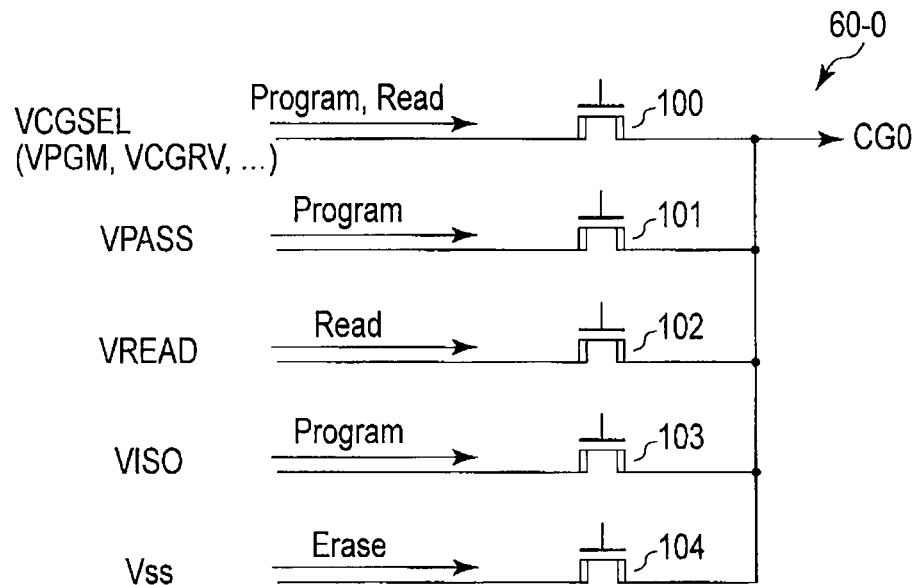
F I G. 7
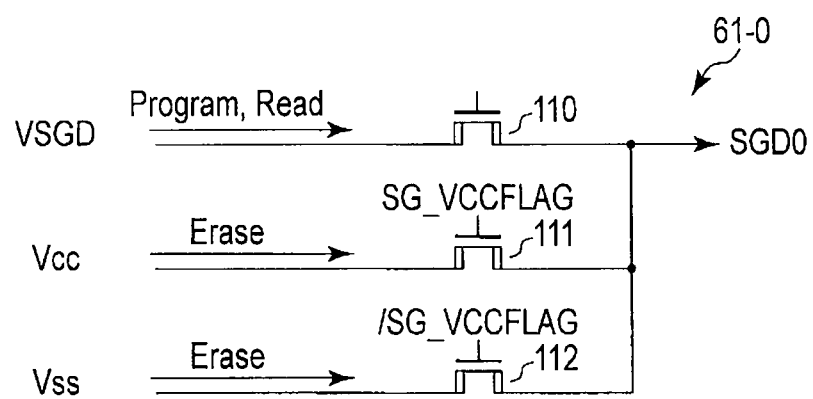
F I G. 8

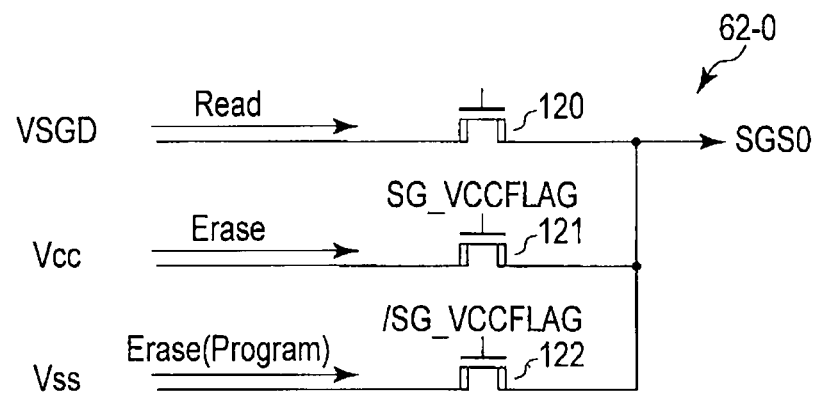
F I G. 9
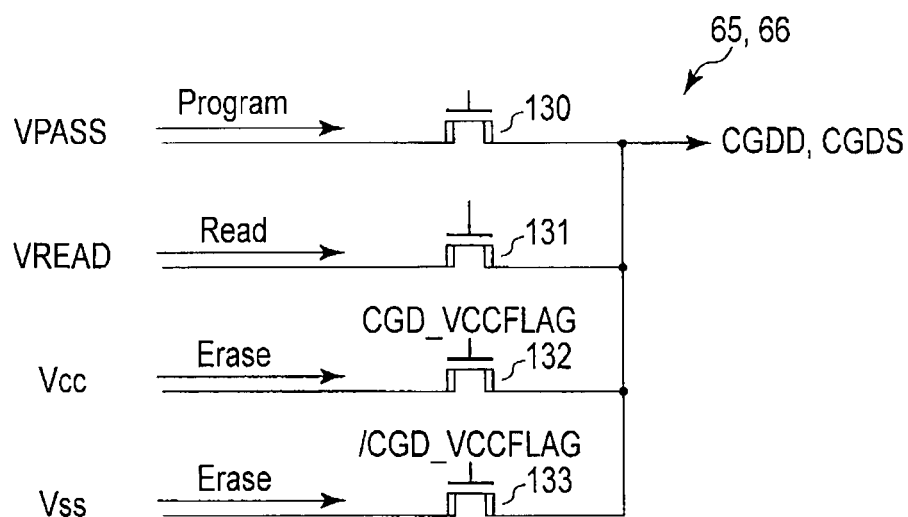
F I G. 10

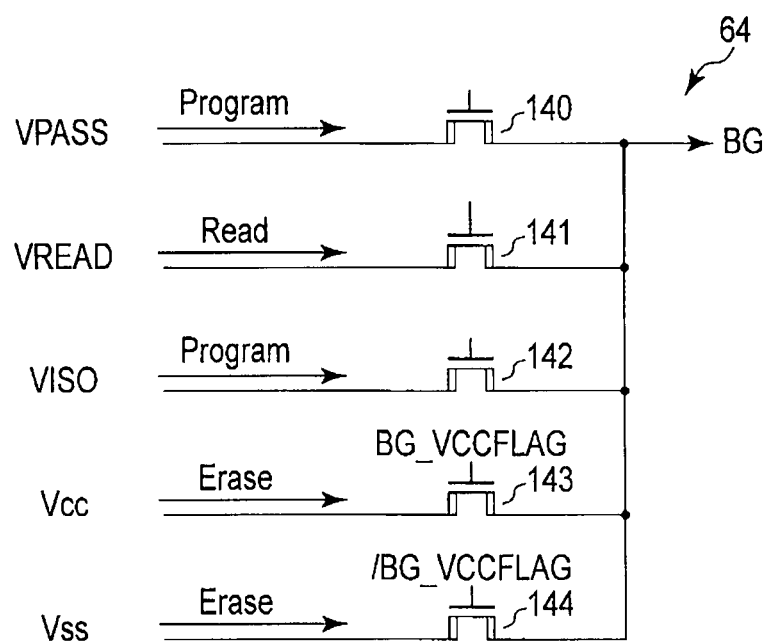
F I G. 1 1

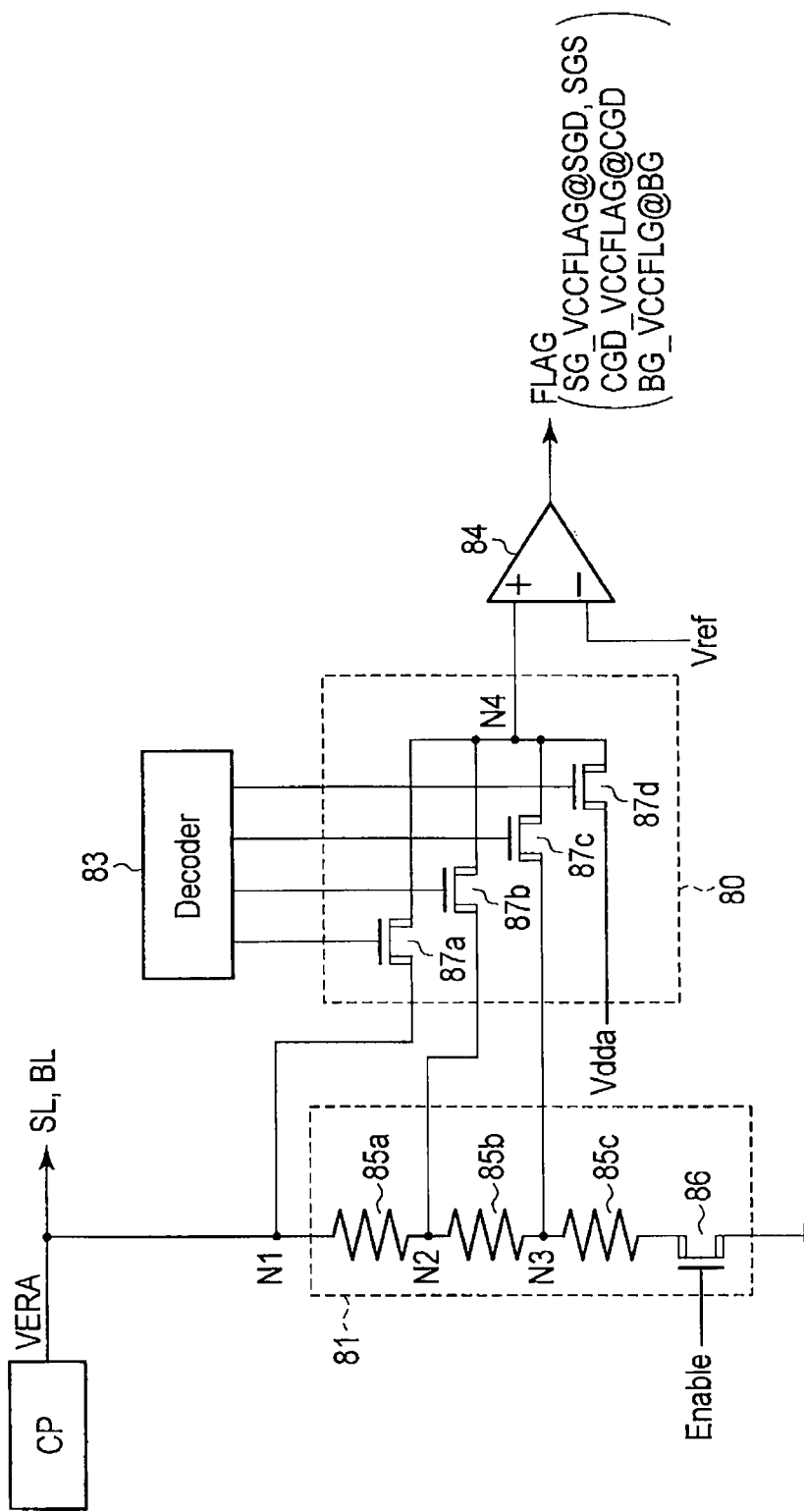
F I G. 12

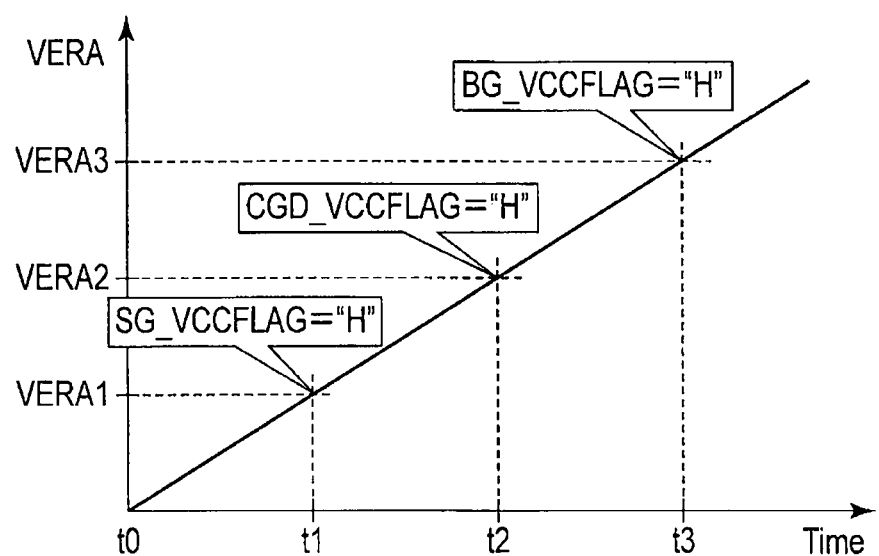
F I G. 1 3

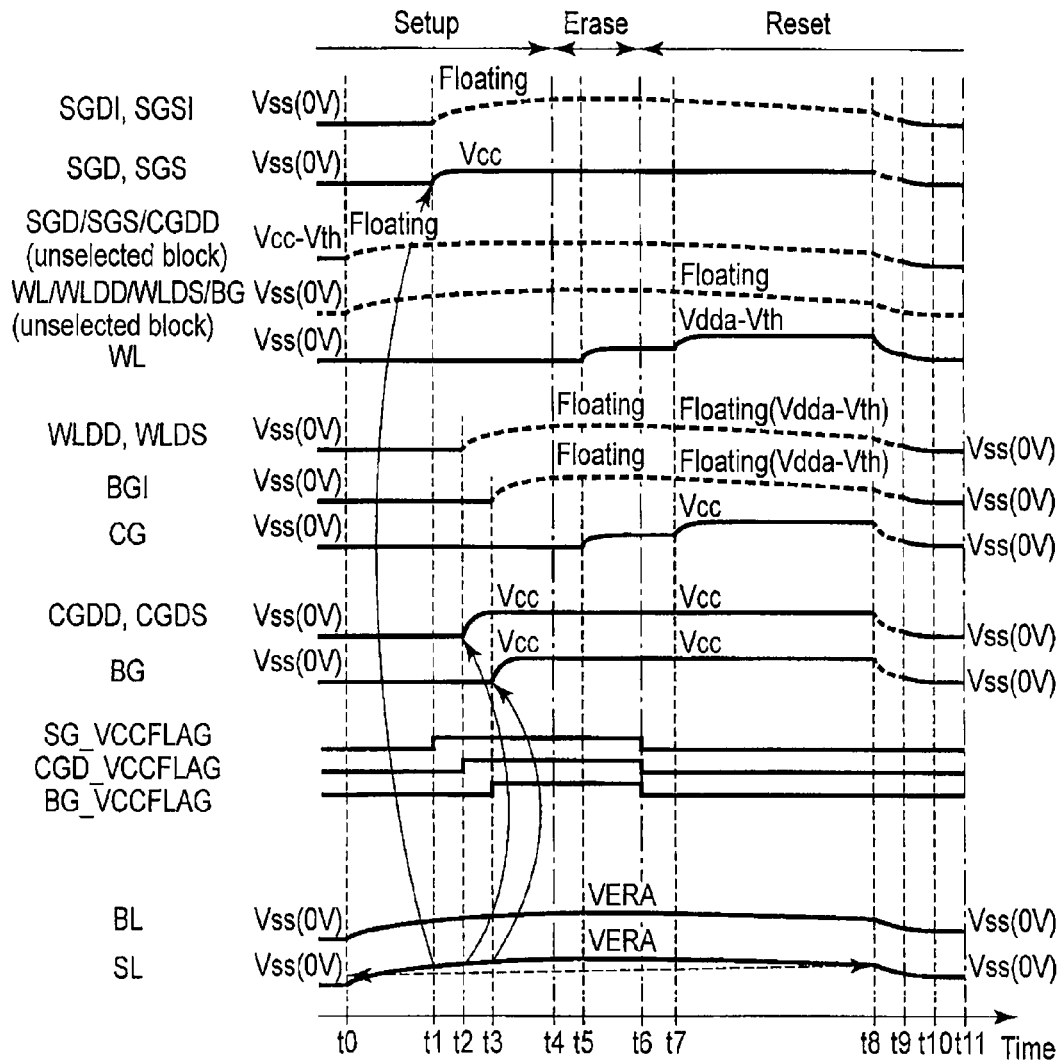
F I G. 1 5

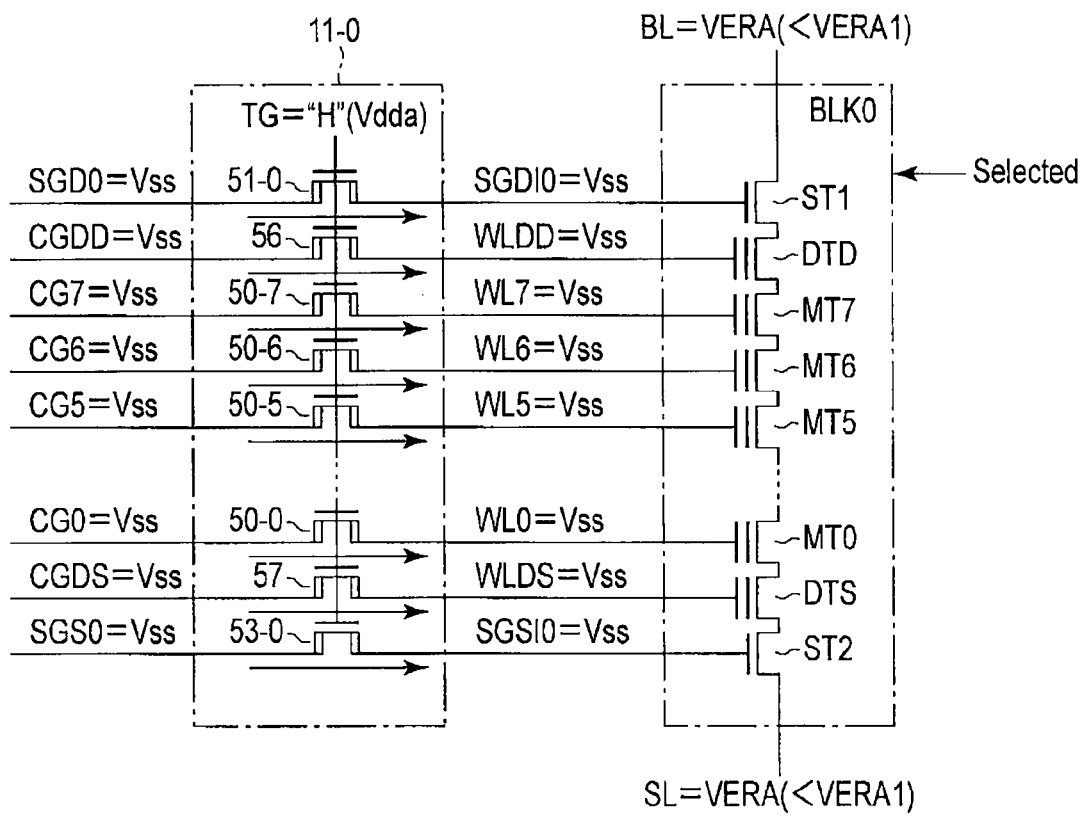
F I G. 16

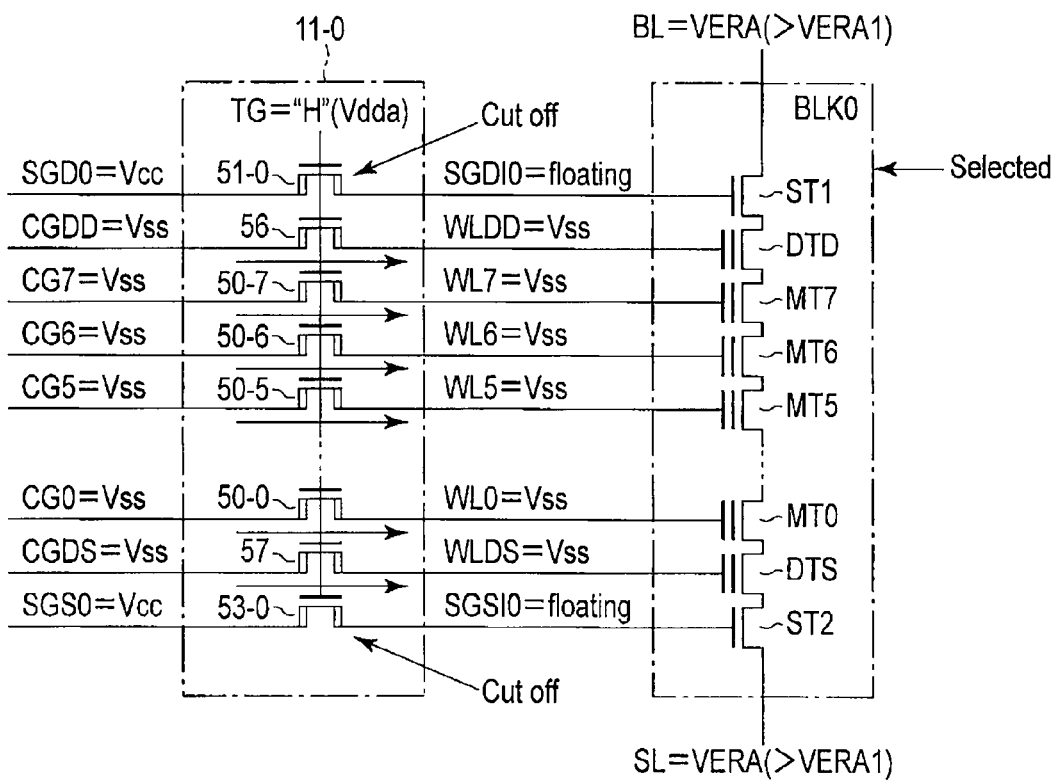
F I G. 17

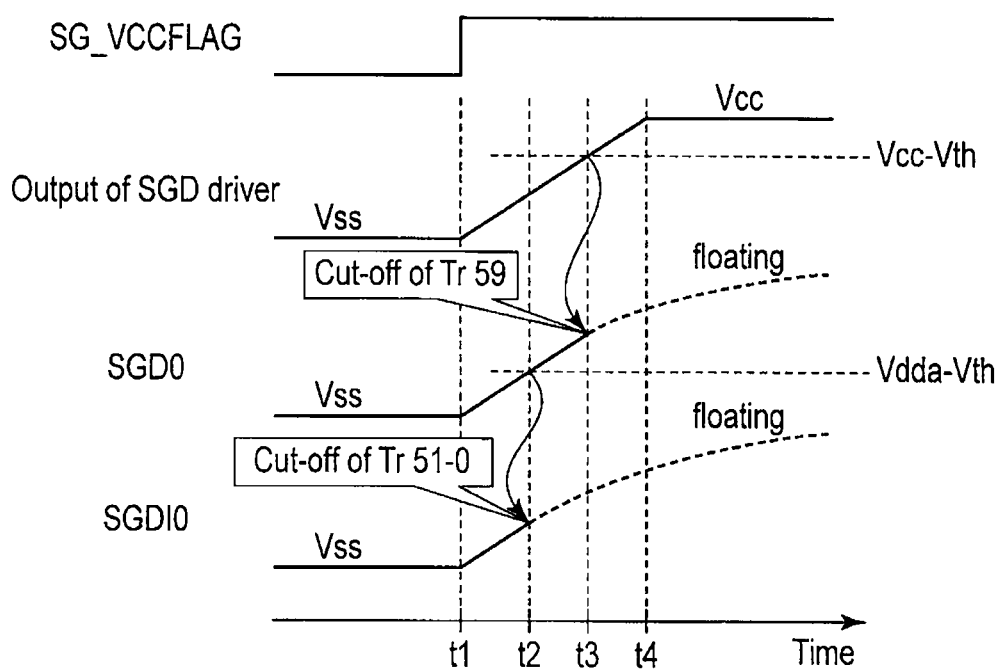
F I G. 2 1

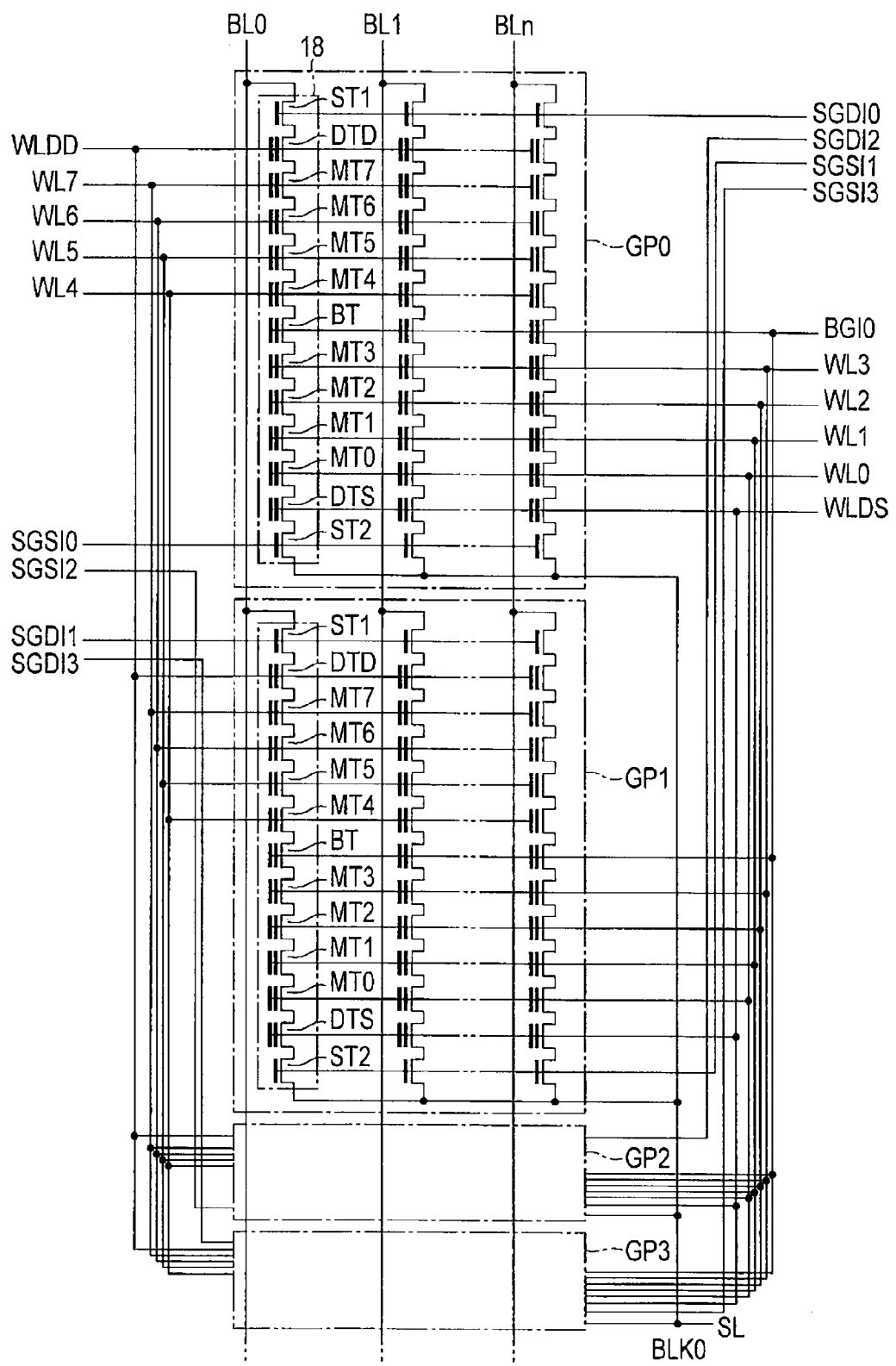
F I G. 22

SEMICONDUCTOR MEMORY DEVICE

CROSS-REFERENCE TO RELATED APPLICATIONS

This application is based upon and claims the benefit of priority from prior Japanese Patent Application No. 2011-219265, filed Oct. 3, 2011, the entire contents of which are incorporated herein by reference.

FIELD

Embodiments described herein relate generally to a semiconductor memory device.

BACKGROUND

There is known a NAND flash memory including three-dimensionally arrayed memory cells.

BRIEF DESCRIPTION OF THE DRAWINGS

FIGS. 2, 3, and 4 are a circuit diagram, a perspective view, and a sectional view, respectively, of a memory cell array according to the first embodiment;

FIG. 5 is a circuit diagram of a NAND string according to the first embodiment;

FIG. 6 is a block diagram of a row decoder, a driver circuit, and a detection circuit according to the first embodiment;

FIGS. 7, 8, 9, 10, and 11 are circuit diagrams of a CG driver, an SGD driver, an SGS driver, CGD driver, and a BG driver according to the first embodiment, respectively;

FIGS. 12 and 13 are respectively a circuit diagram of a detection unit according to the first embodiment and a graph showing the operation of the detection unit;

FIG. 15 is a Liming chart of various signals according to the first embodiment;

FIGS. 16, 17, and 18 are circuit diagrams of the NAND string and the row decoder according to the first embodiment;

FIG. 21 is a timing chart of various signals according to the second embodiment; and FIG. 22 is a circuit diagram of a memory cell array according to a modification of the first and second embodiments.

DETAILED DESCRIPTION

In general, according to one embodiment, a semiconductor memory device includes: first and second select transistors; memory cells; word lines; select gate lines; a driver circuit; first transfer transistors; bit lines; a source line; and a detection circuit. The memory cells are stacked above a semiconductor substrate and have current paths connected in series between the first and second select transistors. Each memory cell includes a charge accumulation layer and a control gate. The word lines are coupled to the control gates of the memory cells. The select gate lines are coupled to the gates of the first and second select transistors. The driver circuit outputs a first voltage. The first transfer transistors are associated with the word lines and the select gate lines to transfer the first voltage output from the driver circuit to associated word lines and select gate lines. The bit lines are coupled to the memory cells via the current path of the first select transistor. The source line is coupled to the memory cells via the current path of the second select transistor. In data erase, the detection circuit detects a second voltage applied to the bit lines and/or the source line and generates a flag in accordance with the detection result. The driver circuit changes the value of the first voltage in response to generation of the flag to cut off the first transfer transistors.

[First Embodiment]

A semiconductor memory device according to the first embodiment will be described. A 3D-stacked NAND flash memory including memory cells stacked above a semiconductor substrate will be exemplified below as the semiconductor memory device.

1. Arrangement of Semiconductor Memory Device

The arrangement of the semiconductor memory device according to this embodiment will be described first.

1.1 Overall Arrangement of Semiconductor Memory Device

Figure 1:
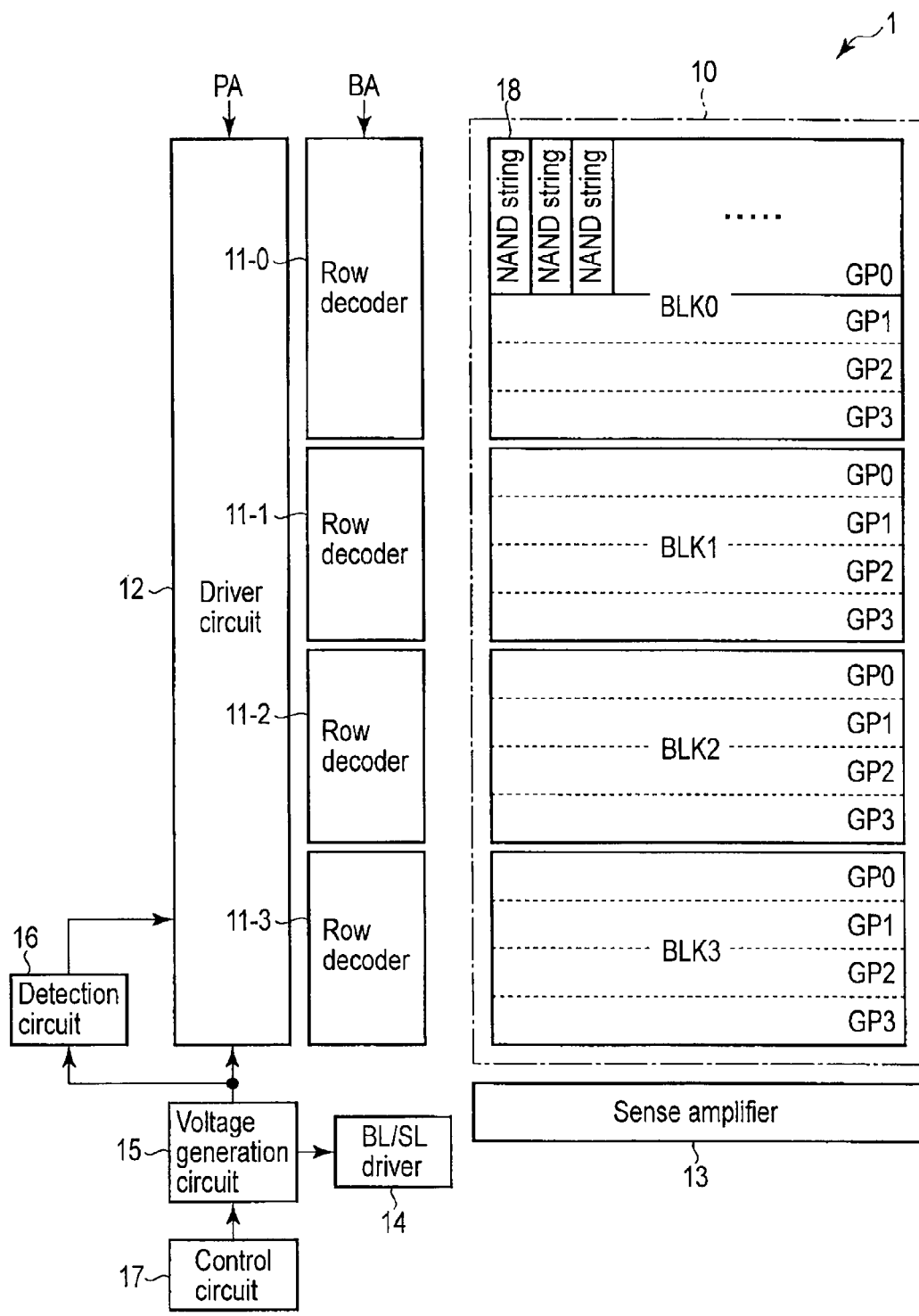
FIG. 1 is a block diagram of a semiconductor memory device according to the first embodiment.

FIG. 1 is a block diagram of the semiconductor memory device according to this embodiment. As shown in FIG. 1, a NAND flash memory 1 comprises a memory cell array 10, row decoders 11 (11-0 to 11-3), a driver circuit 12, a sense amplifier 13, a bit line/source line driver (to be referred to as a BL/SL driver hereinafter) 14, a voltage generation circuit 15, a detection circuit 16, and a control circuit 17.

The memory cell array 10 comprises a plurality of (four, in this example) blocks BLK (BLK0 to BLK3) that are sets of nonvolatile memory cells. Data in the same block BLK are erased at once. Each of the blocks BLK comprises a plurality of (four, in this example) memory groups GP (GP0 to GP3) that are sets of NAND strings 18 formed by connecting the memory cells in series. The number of blocks in the memory cell array 10 and the number of memory groups in each block BLK are arbitrary.

The row decoders 11-0 to 11-3 are provided in correspondence with the blocks BLK0 to BLK3, respectively. Each row decoder 11 selects the row direction of a corresponding one of the blocks BLK.

The driver circuit 12 supplies voltages necessary for the data write, read, and erase to the row decoders 11. The row decoders 11 apply these voltages to the memory cells.

The BL/SL driver 14 applies voltages necessary for the data write, read, and erase to bit lines and a source line to be described later. Especially at the time of erase, the BL/SL driver 14 applies a voltage VERA to bit lines BL and/or a source line SL.

At the time of data read, the sense amplifier 13 senses and amplifies data read from the memory cells. At the time of data write, the sense amplifier 13 transfers write data Lo the memory cells.

The voltage generation circuit 15 generates voltages necessary for the data write, read, and erase and supplies them to the driver circuit 12 and the BL/SL driver 14. Especially at the time of erase, the voltage generation circuit 15 generates the above-described voltage VERA.

At the time of data erase, the detection circuit 16 monitors the voltage VERA generated by the voltage generation circuit 15. The detection circuit 16 generates a flag signal in accordance with the value of the voltage VERA and controls the driver circuit 12.

The control circuit 17 controls the operation of the entire NAND flash memory.

1.2 Memory Cell Array 10

Details of the arrangement of the memory cell array 10 will be described next. FIG. 2 is a circuit diagram of the block BLK0. The blocks BLK1 to BLK3 have the same arrangement as that of the block BLK0.

As shown in FIG. 2, the block BLK0 includes four memory groups GP. Each memory group GP includes n (n is a natural number) NAND strings 18.

Each of the NAND strings 18 includes, for example, eight memory cell transistors MT (MT0 to MT7), select transistors ST1 and ST2, and a backgate transistor BT. Each memory cell transistor MT comprises a stacked gate including a control gate and a charge accumulation layer, and nonvolatilely holds data. Note that the number of memory cell transistors MT is not limited to eight and may be, for example, 16, 32, 64, or 128. The backgate transistor BT also comprises a stacked gate including a control gate and a charge accumulation layer, like the memory cell transistor MT. However, the backgate transistor BT does not hold data and functions as a simple current path in the data write and read. The memory cell transistors MT and the backgate transistor BT are arranged between the select transistors ST1 and ST2 so as to connect the current paths in series. Note that the backgate transistor BT is provided between the memory cell transistors MT3 and MT4. The current path of the memory cell transistor MT7 on one end side of the series connection is connected to one end of the current path of the select transistor ST1. The current path of the memory cell transistor MT0 on the other end side is connected to one end of the current path of the select transistor ST2.

In the arrangement according to this embodiment, a dummy transistor DTD is provided between the select transistor ST1 and the memory cell transistor MT7 so as to serially connect the current paths in each NAND string 18. In addition, a dummy transistor DTS is provided between the select transistor ST2 and the memory cell transistor MT0 so as to serially connect the current paths. The dummy transistors DTD and DTS have the same arrangement as that of the memory cell transistor MT. The dummy transistors are not used to store data and are turned on in the data write and read.

The gates of the select transistors ST1 in the memory groups GP0 to GP3 are commonly connected to select gate lines SGDI0 to SGDI3. The gates of the select transistors ST2 are commonly connected to select gate lines SGDI0 to SGSI3. To the contrary, the control gates of the memory cell transistors MT0 to MT7 in the same block BLK0 are commonly connected to word lines WL0 to WL7, respectively. The control gates of the backgate transistors BT are commonly connected to a backgate line BGI (backgate lines BGI0 to BGI3 are provided in the blocks BLK0 to BLK3, respectively). The control gates of dummy transistors DTD and DTS are commonly connected to dummy word lines WLDD and WLDS, respectively.

That is, the word lines WL0 to WL7, the backgate line BGI, and the dummy word lines WLDD and WLDS are commonly connected between the plurality of memory groups GP0 to GP3 in the same block BLK0. However, the select gate lines SGDI and SGSI are provided independently for the memory groups GP0 to GP3 even in the same block BLK0.

In the memory cell array 10 in which the NAND strings 18 are arranged in a matrix, the other ends of the current paths of the select transistors ST1 in the NAND strings 18 on the same row are commonly connected to one of the bit lines BL (BL0 to BLn, n is a natural number. That is, the bit lines BL commonly connect the NAND strings 18 between the plurality of blocks BLK. The other ends of the current paths of the select transistors ST2 are commonly connected to the source line SL. The source line SL commonly connects the NAND strings 18 between, for example, the plurality of blocks.

As described above, data of the memory cell transistors MT in the same block BLK are erased at once. However, data read and write are done at once for the plurality of memory cell transistors MT commonly connected to one word line in one memory group GP of one block BLK. This unit will be referred to as "page".

The 3D-stacked structure of the memory cell array 10 will be described next with reference to FIGS. 3 and 4. FIGS. 3 and 4 are a perspective view and a sectional view, respectively, of the memory cell array 10.

As shown in FIGS. 3 and 4, the memory cell array 10 is provided above a semiconductor substrate 20. The memory cell array 10 includes a backgate transistor layer L1, a memory cell transistor layer L2, a select transistor layer L3, and an interconnect layer L4 sequentially formed above the semiconductor substrate 20.

The backgate transistor layer L1 functions as the backgate transistor BT. The memory cell transistor layer L2 functions as the memory cell transistors MT0 to MT7 and the dummy transistors DTD and DTS. The select transistor layer L3 functions as the select transistors STI and ST2. The interconnect layer L4 functions as the source line SL and the bit lines BL.

The backgate transistor layer L1 includes a backgate conductive layer 21. The backgate conductive layer 21 is formed to two-dimensionally extend in the row and column directions in parallel to the semiconductor substrate 20. The backgate conductive layer 21 is separated for each block BLK. The backgate conductive layer 21 is made of, for example, polysilicon. The backgate conductive layer 21 functions as the backgate lines BGI.

The backgate conductive layer 21 has a backgate hole 22, as shown in FIG. 4. The backgate hole 22 is made to recess the backgate conductive layer 21. The backgate hole 22 is made into an almost rectangular shape whose longitudinal direction is set along the column direction when viewed from the upper side.

The memory cell transistor layer L2 is formed on the backgate transistor layer L1. The memory cell transistor layer L2 includes word line conductive layers 23a to 23d and dummy word line conductive layers 23e. The conductive layers 23a to 23e are stacked with interlayer dielectric films (not shown) being inserted therebetween. The conductive layers 23a to 23e are formed into stripes extending in the row direction at a predetermined pitch in the row direction. The conductive layers 23a to 23e are made of, for example, polysilicon. The conductive layers 23a function as the control gates of the memory cell transistors MT3 and MT4 (word lines WL3 and WL4). The conductive layers 23b function as the control gates of the memory cell transistors MT2 and MT5 (word lines WL2 and WL5). The conductive layers 23c function as the control gates of the memory cell transistors MT1 and MT6 (word lines WL1 and WL6). The conductive layers 23d function as the control gates of the memory cell transistors MT0 and MT/word lines WL0 and WL7). The conductive layers 23e function as the control gates of the dummy transistors DTD and DTS (dummy word lines WLDD and WLDS). The memory cell transistor layer L2 has memory holes 24, as shown in FIG. 4. The memory holes 24 are made to extend through the conductive layers 23a to 23e. The memory holes 24 are made to align with the end portion of the backgate hole 22 in the column direction.

The backgate transistor layer L1 and the memory cell transistor layer L2 include block insulating layer 25a, charge accumulation layer 25b, tunnel insulating layer 25c, and semiconductor layer 26, as shown in FIG. 4. The semiconductor layer 26 functions as the body of the NAND strings 18 (the backgate of the transistors).

As shown in FIG. 4, the block insulating layer 25a is formed with a predetermined thickness on sidewalls facing the backgate hole 22 and memory holes 24. The charge accumulation layer 25b is formed with a predetermined thickness on the side surfaces of the block insulating layer 25a. The tunnel insulating layer 25c is formed with a predetermined thickness on the side surfaces of the charge accumulation layer 25b. The semiconductor layer 26 is formed in contact with the side surfaces of the tunnel insulating layer 25c.

The semiconductor layer 26 is formed to fill the backgate hole 22 and memory holes 24.

The semiconductor layer 26 is formed into a U-shape when viewed in the row direction. That is, the semiconductor layer 26 includes a pair of pillar portions 26a extending in a direction perpendicular to the surface of the semiconductor substrate 20, and a connecting portion 26b connecting the lower ends of the pair of pillar portions 26a.

The block insulating layer 25a and the tunnel insulating layer 25c are made of, for example, silicon oxide ($SiO_2$). The charge accumulation layer 25b is made of, for example, silicon nitride (SiN). The semiconductor layer 26 is made of polysilicon. The block insulating layer 25a, the charge accumulation layer 25b, the tunnel insulating layer 25c, and the semiconductor layer 26 form a MONOS transistor that functions as the memory cell transistor MT or the dummy transistor DTD or DTS.

In the arrangement of the backgate transistor layer L1, the tunnel insulating layer 25c is formed to surround the connecting portions 26b. The backgate conductive layer 21 is formed to surround the connecting portions 26b.

Also, in the arrangement of the memory cell transistor layer L2, the tunnel insulating layer 25c is formed to surround the pillar portions 26a. The charge accumulation layer 25b is formed to surround the tunnel insulating layer 25c. The block insulating layer 25a is formed to surround the charge accumulation layer 25b. The word line conductive layers 23a to 23d are formed to surround the block insulating layer 25a, the charge accumulation layer 25b, and the tunnel insulating layer 25c and the columnar portions 26a.

As shown in FIGS. 3 and 4, the selection transistor layer L3 includes conductive layers 27a and 27b. The conductive layers 27a and 27b are formed into stripes extending in the row direction so as to have a predetermined pitch in the column direction. A pair of conductive layers 27a and a pair of conductive layers 27b are alternately arranged in the column direction. The conductive layer 27a is formed in an upper layer of one pillar portion 26a, and the conductive layer 27b is formed in an upper layer of the other pillar portion 26a.

The conductive layers 27a and 27b are made of polysilicon. The conductive layer 27a functions as the gate of the select transistor ST2 (select gate line SGSI). The conductive layer 27b functions as the gate of the select transistor STI (select gate line SGDI).

The select transistor layer L3 has holes 28a and 28b, as shown in FIG. 4. The holes 28a and 28b extend through the conductive layers 27a and 27b, respectively. The holes 28a and 28b are aligned with the memory holes 24.

As shown in FIG. 4, the selection transistor layer L3 includes gate insulating layers 29a and 29b, and semiconductor layers 30a and 30b. The gate insulating layers 29a and 29b are respectively formed on sidewalls facing the holes 28a and 28b. The semiconductor layers 30a and 30b are formed into pillars extending in the direction perpendicular to the surface of the semiconductor substrate 20, so as to come in contact with the gate insulating layers 29a and 29b, respectively.

The gate insulating layers 29a and 29b are made of, for example, silicon oxide ($SiO_2$). The semiconductor layers 30a and 30b are made of, for example, polysilicon.

In the arrangement of the selection transistor layer L3, the gate insulating layer 29a is formed to surround the pillar semiconductor layer 30a. The conductive layer 27a is formed to surround the gate insulating layer 29a and semiconductor layer 30a. The gate insulating layer 29b is formed to surround the pillar semiconductor layer 30b. The conductive layer 27b is formed to surround the gate insulating layer 29b and semiconductor layer 30b.

The interconnect layer L4 is formed on the select transistor layer L3, as shown in FIGS. 3 and 4. The interconnect layer L4 includes a source line layer 31, plug layers 32, and bit line layers 33. The source line layer 31 is formed into a plate shape extending in the row direction. The source line layer 31 is formed in contact with the upper surfaces of the pair of conductive layers 30a that are adjacent in the column direction. The plug layers 32 are formed in contact with the upper surfaces of the conductive layers 30b so as to extend in a direction perpendicular to the surface of the semiconductor substrate 20. The bit line layer 33 is formed into stripes extending in the column direction at a predetermined pitch in the row direction. The bit line layer 33 is formed in contact with the upper surfaces of the plug layer 32. The source line layer 31, the plug layer 32, and the bit line layer 33 are made of a metal such as tungsten (W).

The source line layer 31 functions as the source line SL described with reference to FIGS. 1 and 2. The bit line layers 33 function as the bit lines BL.

FIG. 5 shows the equivalent circuit of the NAND string 18 shown in FIGS. 3 and 4. As shown in FIG. 5, the NAND string 18 includes the select transistors ST1 and ST2, the memory cell transistors MT0 to MT7, the dummy transistors DTD and DTS, and the backgate transistor BT. As described above, the memory cell transistors MT are connected in series between the select transistors ST1 and ST2. The backgate transistor BT is connected in series between the memory cell transistors MT3 and MT4. The dummy transistor DTD is connected in series between the select transistor ST1 and the memory cell transistor MT7. The dummy transistor DTS is connected in series between the select transistor ST2 and the memory cell transistor MT0. In the data read, the dummy transistors DTD and DTS and the backgate transistor BT are always ON. In the write, they are turned on as needed.

The control gates of the memory cell transistors MT are connected the word lines WL. The control gates of the dummy transistors DTD and DTS are connected to the dummy word lines WLDD and WLDS. The control gate of the backgate transistor BT is connected to the backgate line BGI. A set of the plurality of NAND strings 18 arrayed along the row direction in FIG. 3 corresponds to each memory group GP described with reference to FIG. 2.

1.3 Row Decoder 11

The arrangement of the row decoder 11 will be described next. The row decoders 11-0 to 11-3 are provided in association with the blocks BLK0 to BLK3, respectively, to select or unselect the blocks BLK0 to BLK3. FIG. 6 illustrates the arrangement of the row decoder 11-0 and the driver circuit 12. Note that the row decoders 11-1 to 11-3 have the same arrangement as that of the row decoder 11-0.

As shown in FIG. 6, the row decoder 11 includes a block decoder 40 and high-withstand-voltage NMOS transistors 50 to 54 (50-0 to 50-7, 51-0 to 51-3, 52-0 to 52-3, 53-0 to 53-3, and 54-0 to 54-3) and 55 to 57.

1.3.1 Block Decoder 40

The block decoder 40 decodes, for example, a block address given by the control circuit 17 at the time of data write, read, and erase. The block decoder 40 generates signals TG and RDECADn in accordance with the decoding result. More specifically, when the block address indicates the block BLK0 corresponding to the row decoder 11-0, the block decoder 40 asserts the signal TG ("H" level, in this example) and negates the signal RDECADn ("L" level, in this example). The voltage of the asserted signal TG is VPGMH in the write, VREADH in the read, and Vdda in the erase. These voltages will be described later.

When the block address does not indicate the block BLK0 corresponding to the row decoder 11-0, the block decoder 40 negates the signal TG ("L" level, for example, Vss (0 V), in this example) and asserts the signal RDECADn ("H" level, in this example).

1.3.2 Transistor 50

The transistor 50 will be described next. The transistors 50 transfer voltages to the word lines WL of the selected block BLK. Each of the transistors 50-0 to 50-7 has a current path with one end connected to a corresponding one of the word lines WL0 to WL7 of the corresponding block BLK0 and the other end connected to a corresponding one of signal lines CG0 to CG7. The block decoder 40 supplies the signal TG to the gates of the transistors 50.

For example, in the row decoder 11-0 corresponding to the selected block BLK0, the transistors 50-0 to 50-7 are turned on to connect the word lines WL0 to WL7 to the signal lines CG0 to CG7. On the other hand, in the row decoders 11-1 to 11-3 corresponding to the unselected blocks BLK1 to BLK3, the transistors 50-0 to 50-7 are turned off to disconnect the word lines WL0 to WL7 from the signal lines CG0 to CG7.

1.3.3 Transistors 51 and 52

The transistors 51 and 52 will be described next.

The transistors 51 and 52 transfer voltages to the select gate lines SGDI. Each of the transistors 51-0 to 51-3 has a current path with one end connected to a corresponding one of the select gate lines SGDI0 to SGDI3 of the corresponding block BLK0 and the other end connected to a corresponding one of signal lines SGD0 to SGD3. The signal TG is supplied to the gates of the transistors 51.

Each of the transistors 52-0 to 52-3 has a current path with one end connected to a corresponding one of the select gate lines SGDI0 to SGDI3 of the corresponding block BLK0 and the other end connected to a node SGD_COM. The signal RDECADn is supplied to the gates of the transistors 52. The node SGD COM corresponds to a voltage of, for example, 0 V that turns off the select transistor STI.

For example, in the row decoder 11-0 corresponding to the selected block BLK0, the transistors 51-0 to 51-3 are turned on, and the transistors 52-0 to 52-3 are turned off. Hence, the select gate lines SGDI0 to SGDI3 of the selected block BLK0 are connected to the signal lines SGD0 to SGD3.

On the other hand, in the row decoders 11-1 to 11-3 corresponding to the unselected blocks BLK1 to BLK3, the transistors 51-0 to 51-3 are turned off, and the transistors 52-0 to 52-3 are turned on. Hence, the select gate lines SGDI0 to SGDI3 of the unselected blocks BLK1 to BLK3 are connected to the node SGD COM.

1.3.4 Transistors 53 and 54

The transistors 53 and 54 transfer voltages to the select gate lines SGSI. The connection and operation are equivalent to those of the transistors 51 and 52 in with the select gate lines SGDI replaced by the select gate lines SGSI.

That is, in the row decoder 11-0 corresponding to the selected block BLK0, the transistors 53-0 to 53-3 are turned on, and the transistors 54-0 to 54-3 are turned off. On the other hand, in the row decoders 11-1 to 11-3 corresponding to the unselected blocks BLK1 to BLK3, the transistors 53-0 to 53-3 are turned off, and the transistors 54-0 to 54-3 are turned on.

1.3.5 Transistor 55

The transistor 55 will be described next. The transistor 55 transfers a voltage to the backgate line BGI. The transistor 55 has a current path with one end connected to the backgate line BGI0 of the corresponding block BLK0 and the other end connected to a signal line BG. The signal TG is supplied to the gate of the transistor 55.

In the row decoder 11-0 corresponding to the selected block BLK0, the transistor 55 is turned on. In the row decoders 11-1 to 11-3 corresponding to the unselected blocks BLK1 to BLK3, the transistors 55 are turned off.

1.3.6 Transistors 56 and 57

The transistors 56 and 57 will be described next. The transistors 56 and 57 transfer voltages to the dummy word lines WLDD and WLDS. The transistor 56 has a current path with one end connected to the dummy word line WLDD of the corresponding block BLK0 and the other end connected to a signal line CGDD. The signal TG is supplied to the gate of the transistor 56. The transistor 57 has a current path with one end connected to the dummy word line WLDS of the corresponding block BLK0 and the other end connected to a signal line CGDS. The signal TG is supplied to the gate of the transistor 57.

In the row decoder 11-0 corresponding to the selected block BLK0, the transistors 56 and 57 are turned on. In the row decoders 11-1 to 11-3 corresponding to the unselected blocks BLK1 to BLK3, the transistors 56 and 57 are turned off.

1.4 Driver Circuit 12

The arrangement of the driver circuit 12 will be described next. The driver circuit 12 transfers voltages necessary for the data write, read, and erase to the signal lines CG0 to CG7, SGD0 to SGD3, SGS0 to SGS3, and BG.

As shown in FIG. 6, the driver circuit 12 comprises CG drivers 60 (60-0 to 60-7), SGD drivers 61 (61-0 to 61-3), SGS drivers 62 (62-0 to 62-3), a voltage driver 63, a BG driver 64, a CGDD driver 65, and a CGDS driver 66.

1.4.1 Voltage Driver 63

The voltage driver 63 will be described first. The voltage driver 63 generates voltages VRDEC and VCGSEL to be used in the block decoder 40 and the CG drivers 60.

The voltage VRDEC is supplied to the block decoder 40. The block decoder 40 corresponding to the selected block outputs the voltage VRDEC as the signal TG. The voltage VCGSEL is supplied to the CG drivers 60. The voltage VCGSEL includes voltages VPGM, VCGRV, and the like to be applied to a selected word line at the time of data write and read.

1.4.2 CG Driver 60

The CG driver 60 will be described next. The CG drivers 60-0 to 60-7 transfer necessary voltages to the signal lines CG0 to CG7 (word lines WL0 to WL7), respectively. FIG. 7 is a circuit diagram of the CG driver 60-0. The remaining CG drivers 60-1 to 60-7 have the same arrangement as that of the CG driver 60-0.

As shown in FIG. 7, the CG driver 60 includes high-withstand-voltage NMOS transistors 100 to 104.

The transistor 100 has a current path with one end receiving the voltage VCGSEL and the other end connected to the corresponding signal line CG (CGi for a CG driver 60-i, i is one of 0 to 7). The transistor 101 has a current path with one end receiving the voltage VPASS and the other end connected to the corresponding signal line CG. The transistor 102 has a current path with one end receiving a voltage VREAD and the other end connected to the corresponding signal line CG. The transistor 103 has a current path with one end receiving a voltage VISO and the other end connected to the corresponding signal line CG. The transistor 104 has a current path with one end receiving the voltage Vss (0 V) and the other end connected to the corresponding signal line CG.

In the above-described arrangement, for example, the control circuit 17 inputs a signal representing a page address (word line address) to the gates of the transistors 100 to 104. In the CG driver 60 corresponding to the selected word line, the transistor 100 is turned on to transfer the voltage VCGSEL=VPGM to the corresponding signal line CG in the programming. In the read, the transistor 100 is turned on to transfer the voltage VCGSEL=VCGRV to the corresponding signal line CG. These voltages are transferred to the selected word line WL via the current path of the transistor 50 in the row decoder 11.

In the CG driver 60 corresponding to an unselected word line, the transistor 101 or 103 is turned on in the programming. The CG driver 60 in which the transistor 101 is turned on transfers the voltage VPASS to the corresponding signal line CG. The CG driver 60 in which the transistor 103 is turned on transfers the voltage VISO (for example, 0 V) to the corresponding signal line CG. In the read, the transistor 102 is turned on to transfer the voltage VREAD to the corresponding signal line CG. These voltages are transferred to the unselected word line WL via the current path of the transistor 50 in the row decoder 11.

In the erase, the transistor 104 is turned on. The voltage Vss (for example, 0 V) is thus transferred to the word line WL via the current path of the transistor 50 in the row decoder 11.

Note that the voltages VPASS and VREAD turn on the memory cell transistor MT independently of held data. The voltage VISO turns off the memory cell transistor MT independently of held data. The voltages VPGMH, VREADH, and Vdda given as the signal. TG are higher than the voltages VPGM, VREAD, and Vss and enable transfer of the voltages VPGM, VREAD, and Vss by the transistor 50.

The signal lines CG0 to CG7 may be shared by the blocks BLK. That is, the four word lines WL0 respectively belonging to the four blocks BLK0 to BLK3 may be driven by the single CG driver 60-0 via the transistors 50-0 of the corresponding row decoders 11-0 to 11-3. This also applies to the remaining signal lines CG1 to CG7. This also applies to the remaining interconnects SGD, SGS, BG, CGDD, and CGDS. This case will be exemplified below.

1.4.3 SGD Driver 61

The SGD driver 61 will be described next. The SGD drivers 61-0 to 61-3 transfer necessary voltages to the signal lines SGD0 to SGD3 (select gate lines SGDI0 to SGDI3), respectively. FIG. 8 is a circuit diagram of the SGD driver 61-0. The remaining SGD drivers 61-1 to 61-3 have the same arrangement as that of the SGD driver 61-0.

As shown in FTG. 8, the SGD driver 61 includes high-withstand-voltage NMOS transistors 110 to 112. The transistor 110 has a current path with one end receiving a voltage VSGD and the other end connected to the corresponding signal line SGD (SGDj for a SGD driver 61-j, j is one of 0 to 3). The transistor 111 has a current path with one end receiving an external voltage Vcc (>Vss) and the other end connected to the corresponding signal line SGD. The transistor 112 has a current path with one end receiving the voltage Vss and the other end connected to the corresponding signal line SGD.

When the SGD driver 61 corresponds to the NAND string 18 including a selected cell, for example, the control circuit 17 turns on the transistor 110 at the time of data write and read to transfer the voltage VSGD to the corresponding select gate line SGDI via the current path of the corresponding transistor 51. The voltage VSGD turns on the select transistor ST1 in the read and also turns on the select transistor ST1 in the write in accordance with write data. In the erase, the transistors 111 and 112 are turned on in accordance with flag signals SG_VCCFLAG and/SG_VCCFLAG (inverted signal of SG_VCCFLAG). The flag signal SG_VCCFLAG is given by the detection circuit 16. The flag signals will be described later in detail.

When the SGD driver 61 does not correspond to the NAND string 18 including the selected cell, the transistors 110 to 112 are turned off.

1.4.4 SGS Driver 62

The SGS driver 62 will be described next. The SGS drivers 62-0 to 62-3 transfer necessary voltages to the signal lines SGS0 to SGS3 (select gate lines SGSI0 to SGSI3), respectively. FIG. 9 is a circuit diagram of the SGS driver 62-0. The remaining SGS drivers 62-1 to 62-3 have the same arrangement as that of the SGS driver 62-0.

As shown in FIG. 9, the SGS driver 62 includes high-withstand-voltage NMOS transistors 120 to 122. The transistor 120 has a current path with one end receiving a voltage VSGS and the other end connected to the corresponding signal line SGS (SGSk for a SGS driver 62-k, k is one of 0 to 3). The transistor 121 has a current path with one end receiving the external voltage Vcc and the other end connected to the corresponding signal line SGS. The transistor 122 has a current path with one end receiving the voltage Vss and the other end connected to the corresponding signal line SGS.

When the SGS driver 62 corresponds to the NAND string 18 including a selected cell, for example, the control circuit 17 turns on the transistor 120 at the time of data read to transfer the voltage VSGS to the corresponding select gate line SGSI via the current path of the corresponding transistor 53. The voltage VSGS turns on the select transistor ST2 in the read. In the write, the transistor 122 is turned on to transfer the voltage Vss to the corresponding select gate line SGSI. In the erase, the transistors 121 and 122 are turned on in accordance with the flag signals SG_VCCFLAG and/SG_VCCFLAG.

When the SGS driver 62 does not correspond to the NAND string 18 including the selected cell, the transistors 120 to 122 are turned off.

1.4.5 CGDD Driver 65 and CGDS Driver 66

The CGDD driver 65 and the CGDS driver 66 will be described next. FIG. 10 is a circuit diagram of the CGDD driver 65.

As shown in FIG. 10, the CGDD driver 65 comprises high-withstand-voltage NMOS transistors 130 to 133. The transistor 130 has a current path with one end receiving the voltage VPASS and the other end connected to the signal line CGDD. The transistor 131 has a current path with one end receiving the voltage VREAD and the other end connected to the signal line CGDD. The transistor 132 has a current path with one end receiving the voltage Vcc and the other end connected to the signal line CGDD. The transistor 133 has a current path with one end receiving the voltage Vss and the other end connected to the signal line CGDD.

In data write, for example, the control circuit 17 turns on the transistor 130 to transfer the voltage VPASS to the dummy word line WLDD via the current path of the transistor 56. In the read, for example, the control circuit 17 turns on the transistor 131 to transfer the voltage VREAD to the dummy word line WLDD via the current path of the transistor 56. In the erase, the transistors 132 and 133 are turned on in accordance with flag signals CGD_VCCFLAG and/CGD_VC- CFLAG (/CGD_VCCFLAG is the inverted signal of CGD_VCCFLAG). The flag signal CGD_VCCFLAG is given by the detection circuit 16.

The above-described arrangement also applies to the CGDS driver 66. The CGDS driver 66 is equivalent to a circuit in which CGDD is replaced with CGDS in FIG. 10.

1.4.6 BG Driver 64

The BG driver 64 will be described next. FIG. 11 is a circuit diagram of the BG driver 64. As shown in FIG. 11, the BG driver 64 comprises high-withstand-voltage NMOS transistors 140 to 144. The transistor 140 has a current path with one end receiving the voltage VPASS and the other end connected to the signal line BG. The transistor 141 has a current path with one end receiving the voltage VREAD and the other end connected to the signal line BG. The transistor 142 has a current path with one end receiving the voltage VISO and the other end connected to the signal line BG. The transistor 143 has a current path with one end receiving the voltage Vcc and the other end connected to the signal line BG. The transistor 144 has a current path with one end receiving the voltage Vss and the other end connected to the signal line BG.

In data write, for example, the control circuit 17 turns on the transistor 140 or 142 to transfer the voltage VPASS or VISO to the backgate line BGI via the current path of the transistor 55. In the read, for example, the control circuit 17 turns on the transistor 141 to transfer the voltage VREAD to the backgate line BGI via the current path of the transistor 55. In the erase, the transistors 143 and 144 are turned on in accordance with flag signals RG_VCCFLAG and/BG_VCCFLAG (/BG_VCCFLAG is the inverted signal of BG_VCCFLAG). The flag signal BG_VCCFLAG is given by the detection circuit 16.

1.5 Voltage Generation Circuit 15

The voltage generation circuit 15 comprises a plurality of charge pump circuits. The voltage generation circuit 15 generates the voltages VPGMH, VPGM, and VPASS in the write, the voltages VREADH, VREAD, and VCGRV in the read, and the voltage VERA in the erase.

1.6 Detection Circuit 16

The detection circuit 16 will be described next. The detection circuit 16 comprises first to third detection units 70-1 to 70-3, as shown in FIG. 6.

In the erase, the first to third detection units 70-1 to 70-3 monitor the voltage VERA generated by the voltage generation circuit 15. The first to third detection units 70-1 to 70-3 generate the above-described flag signals SG_VCCFLAG, CGD_VCCFLAG, and BG_VCCFLAG in accordance with the value of the voltage VERA. The first to third detection units 70-1 to 70-3 will generically be referred to as detection units 70 hereinafter without discrimination.

FIG. 12 is a circuit diagram of the detection unit 70. As shown in FIG. 12, each detection unit 70 includes a switch unit 80, a variable resistance unit 81, a decoder 83, and a comparator 84.

The variable resistance unit 81 includes, for example, three resistive elements 85a to 85c and a high-withstand-voltage NMOS transistor 86. The resistive element 85a has one terminal connected to a node N1 and the other terminal connected to a node N2. The resistive element 85b has one terminal connected to the node N2 and the other terminal connected to a node N3. The resistive element 85c has one terminal connected to the node N3 and the other terminal connected to the drain of the transistor 86. The transistor 86 has a source grounded and a gate receiving a control signal "Enable". The control signal "Enable" is given by, for example, the control. circuit 17 and asserted ("H" level, in this example) in the erase. In the erase, the voltage VERA generated by a charge pump circuit CP of the voltage generation circuit 15 is given to the node N1. The BL/SL driver 14 gives the voltage VERA to the bit lines BL and the source line SL.

The switch unit 80 includes high-withstand-voltage NMOS transistors 87a to 87d. Each of the transistors 87a to 87c has a current path with one end connected to a corresponding one of the nodes N1 to N3. The voltage Vdda is applied to one end of the current path of the transistor 87d. The other end of the current path of each of the transistors 87a to 87d is commonly connected to a node N4.

The decoder 83 selects one of the transistors 87a to 87d and supplies "H" level to the gate of the selected one of the transistors 87a to 87d to turn on the selected transistor.

The comparator 84 is an operational amplifier having an inverting input terminal (−) receiving a reference voltage Vref and a noninverting input terminal (+) connected to the node N4.

In the above-described arrangement, the decoder 83 turns on one of the transistors 87a to 87d in the erase. As a result, a voltage obtained by dividing the voltage VERA in the variable resistance unit 81 is given to the node N4. When the potential of the node N4 reaches the reference voltage Vref, the comparator 84 generates one of flag signals SG_VCCFLAG, CGD_VCCFLAG, and BG_VCCFLAG.

FIG. 13 is a graph showing the relationship between the voltage VERA and the flag signals. When the voltage VERA reaches VERA1, the potential of the node N4 in the first detection unit 70-1 reaches the reference voltage Vref. Hence, the first detection unit 70-1 outputs a flag signal. That is, the first detection unit 70-1 asserts the flag signal SG_VCCFLAG ("H" level, in this example).

When the voltage VERA reaches VERA2 (>VERA1), the second detection unit 70-2 outputs a flag signal. That is, the second detection unit 70-2 asserts the flag signal CGD_VCCFLAG ("H" level, in this example).

When the voltage VERA reaches VERA3 (>VERA2), the third detection unit 70-3 outputs a flag signal. That is, the third detection unit 70-3 asserts the flag signal BG_VCCFLAG ("H" level, in this example).

2. Erase Operation of Semiconductor Memory Device 1

Figure 14:
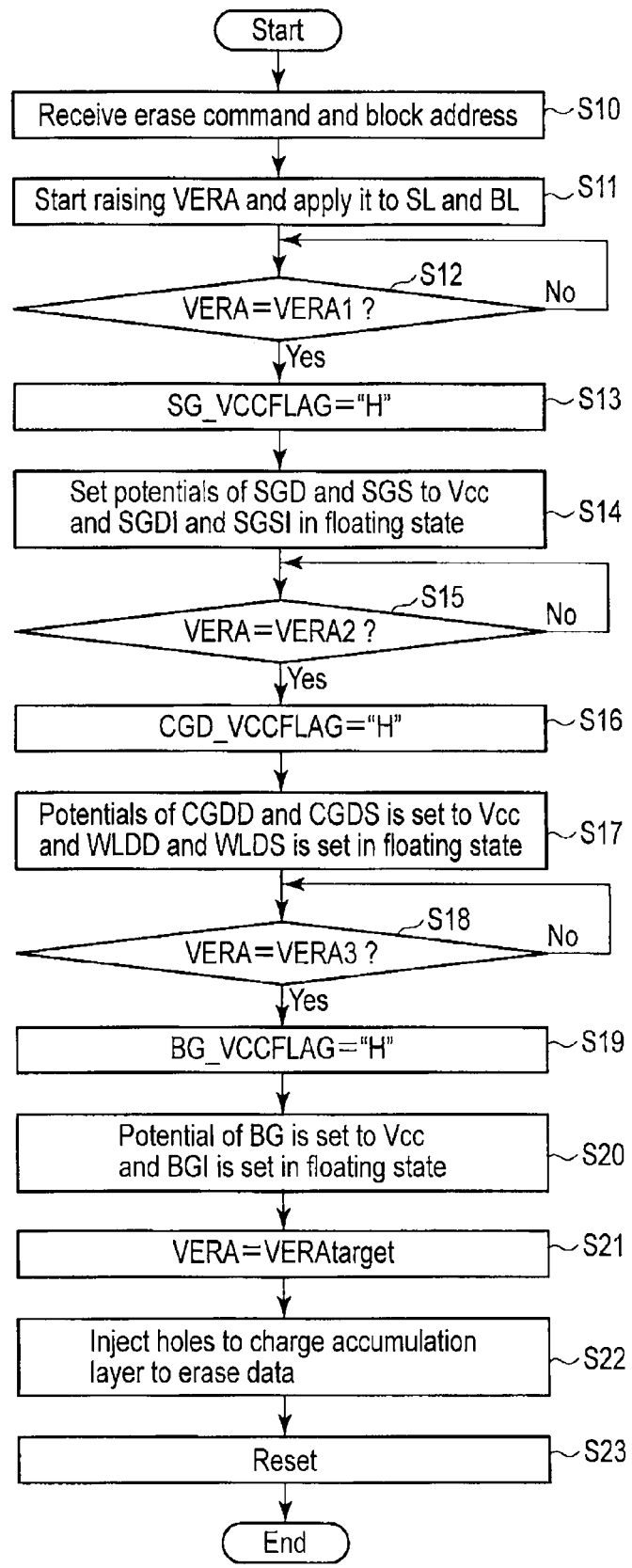
FIG. 14 is a flowchart of an erase operation according to the first embodiment.

The operation of the NAND flash memory having the above-described arrangement will be explained next. FIG. 14 is a flowchart of the erase operation. FIG. 15 is a timing chart showing changes in the potentials of the nodes in the erase.

First, the control circuit 17 receives an erase command from an external host device. At this time, the control circuit 17 also receives the block address of the erase target block (step S10). Upon receiving the erase command, the control circuit 17 starts the erase sequence.

The erase sequence roughly includes three phases "setup", "erase", and "reset", as shown in FIG. 15. "Setup" is the phase to prepare the voltages necessary for the erase. "Erase" is the phase to actually inject holes into the charge accumulation layer to erase data. "Reset" is the phase to return the voltage of each node to the state before the erase operation.

At first, the control circuit 17 starts setup. More specifically, the control circuit 17 instructs the voltage generation circuit 15 to generate and boost the voltage VERA. The BL/SL driver 14 applies the voltage VERA to the bit lines BL and the source line SL in response to the instruction from the control circuit 17 (step S11, time t0 in FIG. 15).

FIG. 16 shows the states of the erase target block BLK0 and the row decoder 11-0 associated with the block BLK0 at this time. The block decoder 40 sets the signal TG="H (=Vdda)" level and the signal RDECADn="L (=Vss)" level. The SGD driver 61-0, the SGS driver 62-0, the CG drivers 60, the BG driver 64, the CGDD driver 65, and the CGDS driver 66 output the voltage Vss. Hence, in the row decoder 11-0, all the transistors 51-0, 53-0, 50-0 to 50-7, 55, 56, and 57 are turned on. Hence, the potentials of the lines SGDI0, SGSI0, WL0 to WL7, BGI0, WLDD, and WLDS are set to Vss.

At time t1, the value of the voltage VERA reaches VERA1 (YES in step S12). Then, the first detection unit 70-1 outputs the flag signal SG VCCFLAG (step S13).

FIG. 17 shows the states of the block BLK0 and the row decoder 11-0 when the flag signal SG VCCFLAG is output. When the flag signal SG VCCFLAG is output, the transistors 111 and 121 in the SGD driver 61-0 and the SGS driver 62-0 are turned on to transfer the voltage Vcc to the signal lines SGD0 and SGS0, as shown in FIG. 17. Since Vcc>Vdda, the transistors 51-0 and 53-0 in the row decoder 11-0 are cut off, and the select gate lines SGDI0 and SGSI0 are set in an electrically floating state (step S14).

At time t2, the value of the voltage VERA reaches VERA2 (YES in step S15). Then, the second detection unit 70-2 outputs the flag signal CGD_VCCFLAG (step S16).

Figure 18:
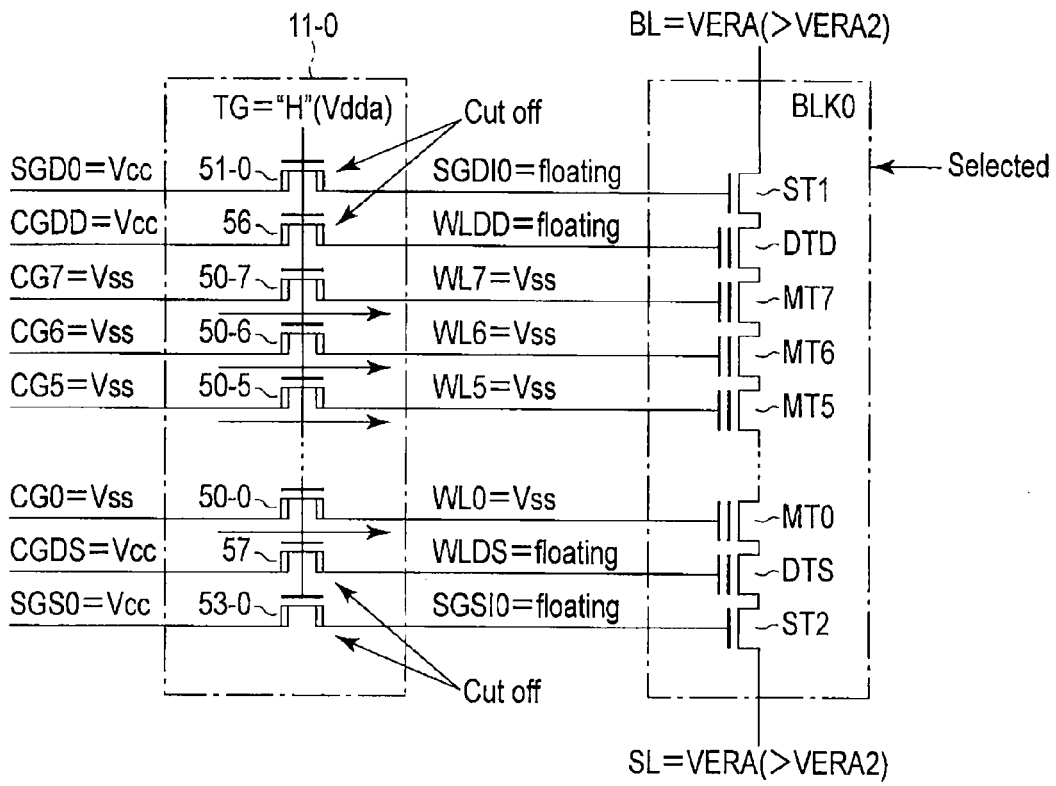

FIG. 18 shows the states of the block BLK0 and the row decoder 11-0 when the flag signal CGD_VCCFLAG is output. When the flag signal CGD_VCCFLAG is output, the transistors 132 in the CGDD driver 65 and the CGDS driver 66 are turned on to transfer the voltage Vcc to the signal lines CGDD and CGDS, as shown in FIG. 18. The transistors 56 and 57 in the row decoder 11-0 are cut off, and the dummy word lines WLDD and WLDS are set in an electrically floating state (step S17).

At time t3, the value of the voltage VERA reaches VERA3 (YES in step S18). Then, the third detection unit 70-3 outputs the flag signal BG VCCFLAG (step S19).

When the flag signal BG_VCCFLAG is output, the transistor 143 in the BG driver 64 is turned on to transfer the voltage Vcc to a signal line BG0. The transistor 55 in the row decoder 11-0 is cut off, and the backgate line BGI is set in an electrically floating state (step S20).

At time t4, the voltage VERA reaches a desired voltage VERAtarget (step S21), and the erase operation transits to the erase phase. Note that during the period from time t0 to time t5, the transistors 104 in the CG drivers 60 are on, the transistors 50 in the row decoder 11-0 are always on, and the voltage Vss is always applied to the word lines WL. In the erase phase, holes generated by GIDL (Gate Induced Drain Leakage) are injected into the charge accumulation layer to erase data (step S22).

When the erase phase ends, the erase operation transits to the reset phase (step S23, time t6). More specifically, the detection units 70 stop outputting the flag signals SG_VCCFLAG, CGD_VCCFLAG, and BG_VCCFLAG (negate ("L" level, in this example)). After raising the potentials of the lines CG and WL to Vcc, the voltages of the nodes are lowered stepwise up to Vss under the control of the control circuit 17. The erase operation thus ends.

Note that during the erase operation, the lines SGD, SGS, CGDD, CGDS, WL, WLDD, WLDS, and BG of the unselected blocks BLK1 to BLK3 are set in the electrically floating state. Their potentials are determined by coupling with the voltage VERA.

3. Effects according to This Embodiment

The arrangement according to this embodiment can improve the operation reliability of the NAND flash memory. This effect will be described below.

In the 3D-stacked NAND flash memory, the channel portion of a NAND string is made of intrinsic silicon. Hence, when GIDL is caused at the end of the select gate, holes are generated.

To cause GIDL, an appropriate voltage needs to be applied to each node. To efficiency cause GIDL, a relationship given by VERA>VERAsg>VERAd>VERAw1 ($\approx$0 V) needs to be satisfied, where VERA, VERAsg, VERAd, and VERAw1 are voltages of source line, select gate line, dummy word line, and erase target word line, respectively.

As described above, many types of voltages are necessary in the erase. If the load capacity increases, the charging operation greatly slows down, and the current consumption of the power supply circuit including the charge pump circuits and the step-down circuit increases.

In the arrangement according to the embodiment, a step-up voltage generated by charge pump circuit is needed for only the voltage VERA to be applied to the source line SL and the bit lines BL, and the potentials of the other nodes are raised by coupling. For this reason, the power consumption can be reduced.

That is, the NAND flash memory 1 according to this embodiment includes the detection circuit 16 that detects the voltage VERA. When the voltage VERA reaches an appropriate potential, the detection circuit 16 outputs a flag signal. Based on this flag signal, the select gate lines SGDI and SGSI, the backgate line BGI, and the dummy word lines WLDD and WLDS are set in the electrically floating state. More specifically, the driver circuit 12 outputs the voltage Vcc to the signal lines SGD, SGS, BG, CGDD, and CGDS in response to the flag signal. The transistors 51, 53, and 55 to 57 in the row decoder 11 are thus cut off, and the corresponding interconnects are set in the electrically floating state.

Figure 19:
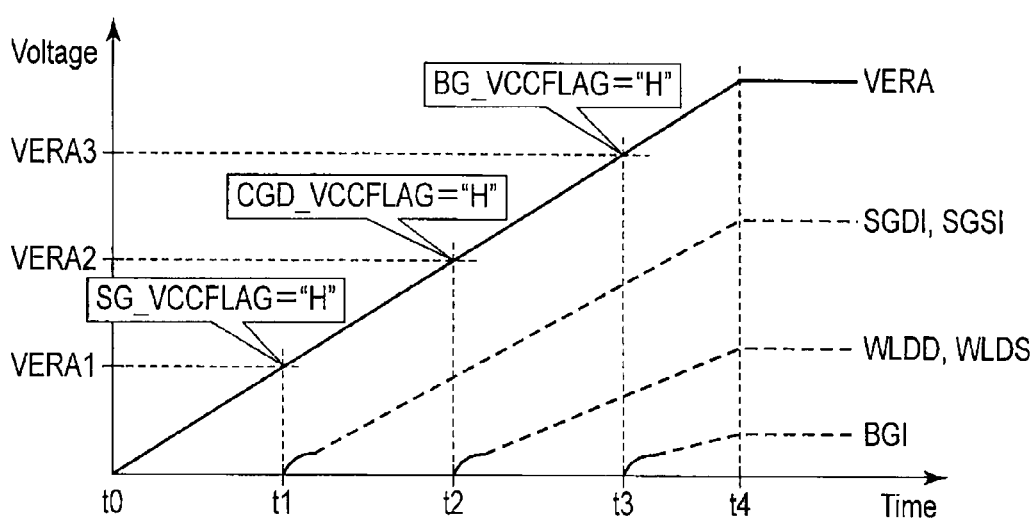
FIG. 19 is a graph showing changes in the potentials of lines according to the first embodiment.

The potentials of the interconnects set in the floating state then rise by coupling with the voltage VERA and reach a desired potential. FIG. 19 is a graph showing changes in the voltage VERA and the potentials of the select gate lines SGDI and SGSI, the dummy word lines WLDD and WLDS, and the backgate line BGI.

As shown in FIG. 19, at time t0, the voltage generation circuit 15 starts raising the voltage VERA. At time t4, the voltage VERA reaches the desired voltage VERAtarget. At time t1 where the voltage VERA reaches VERA1, the flag signal SG_VCCFLAG changes to "H" level. The voltage Vcc is thus applied to the signal lines SGD and SGS. The select gate lines SGDI and SGSI are set in the electrically floating state after reaching almost (Vdda-Vth) (Vth is the threshold voltage of the transistors 51 and 53). After that, the potentials of the select gate lines reach the desired voltage (above-described VERAsg) at time t4 by coupling with the voltage VERA. At time t2 where the voltage VERA reaches VERA2, the flag signal CGD VCCFLAG changes to "H" level. The voltage Vcc is thus applied to the signal lines CGDD and CGDS. The dummy word lines WLDD and WLDS are set in the electrically floating state after reaching almost (Vdda-Vth) (Vth is the threshold voltage of the transistors 56 and 57). After that, the potentials of the dummy word lines reach the desired voltage (above-described VERAd) at time t4 by coupling with the voltage VERA. This also applies to the backgate line BGI.

As described above, the select gate lines SGDI and SGSI, the dummy word lines WLDD and WLDS, and the backgate line BGI reach the desired voltages by coupling. Hence, the charge pump circuits that generate VERAsg, VERAd, and the like in the erase are unnecessary. The charge pump circuit that generates the voltage VERAtarget to be applied to the bit lines BL and the source line SL suffices.

This also applies to erase in NAND string unit (memory group GP unit) or memory cell unit (page unit). In this case, the potentials of unselected word lines are raised by coupling, as in the select gate lines and the like. Especially when performing erase in NAND string unit or memory cell unit, the number of types of voltages required increases as compared to the erase in block unit. Hence, this embodiment can obtain a more remarkable effect in this case as well.

The arrangement according to the embodiment can speed up the erase operation. The charge pump circuits are generally difficult to control, and no optimum voltage can be obtained unless an appropriate operation condition is satisfied in accordance with the load. It is very difficult to satisfy the optimum operation condition. The potential of each node does not necessarily rise under the optimum condition in the high-speed operation. The larger the number or charge pump circuits, the harder the control is. As a result, it takes longer time for each node to reach the potential necessary for the erase operation. However, in the arrangement according to the embodiment, the number of charge pump circuits to be operated can be one at least in the erase. The nodes to be charged by coupling are limited, and the other nodes need not be charged (charging to Vcc level suffices). More specifically, the nodes on the side of the peripheral circuits (the side of the driver circuit 12) outside the row decoder 11 need not be charged. It is therefore possible to speed up the erase operation as compared to the case in which the nodes are charged using a plurality of charge pump circuits.

[Second Embodiment]

A semiconductor memory device according to the second embodiment will be described next. In this embodiment, a switch is provided between a driver circuit 12 and a row decoder 11 in the first embodiment. Only points different from the first embodiment will be described below.

1. Arrangement of Semiconductor Memory Device 1

Figure 20:
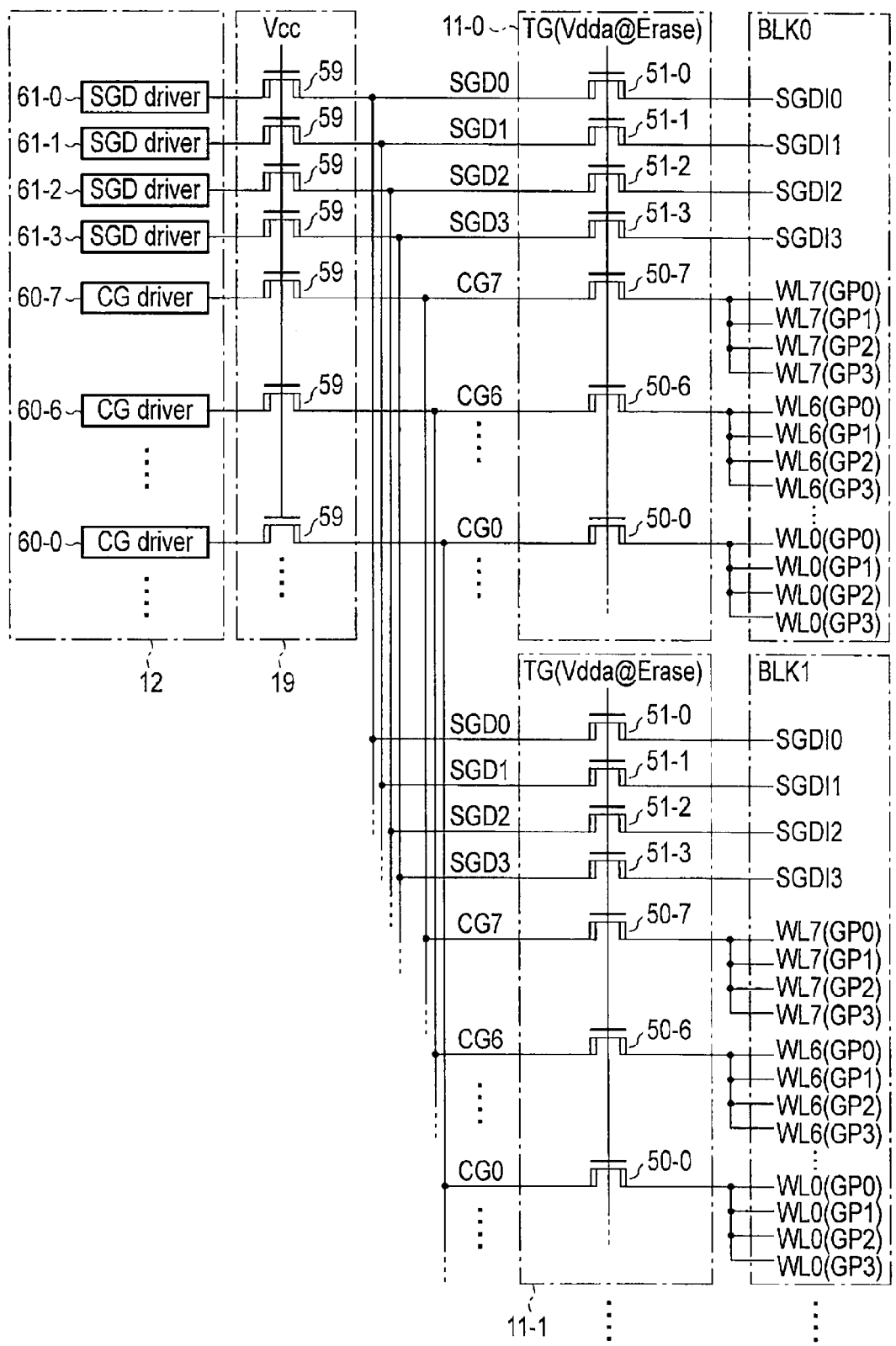
FIG. 20 is a block diagram of a partial region of a semiconductor memory device according to the second embodiment.

The arrangement of a NAND flash memory 1 according to this embodiment will be described first with reference to FIG. 20. FIG. 20 is a circuit diagram showing the arrangement of a partial region of the NAND flash memory 1.

As shown in FIG. 20, the arrangement according to this embodiment further includes a row selection switch unit 19 in FIGS. 1 and 6 described in the first embodiment.

The row selection switch unit 19 includes a plurality of high-withstand-voltage NMOS transistors 59 provided in correspondence with SGD drivers 61-0 to 61-3, SGS drivers 62-0 to 62-3, CG drivers 60-0 to 60-7, a BG driver 64, a CGDD driver 65, and a CGDS driver 66 of the driver circuit 12.

Each of the transistors 59 has a current path with one end connected to the output node of a corresponding one of the drivers 61-0 to 61-3, 62-0 to 62-3, 60-0 to 60-7, and 64 to 66 and the other end connected to a corresponding one of signal lines SGD0 to SGD3, SGS0 to SGS3, CG0 to CG7, BG, CGDD, and CGDS. For example, a control circuit 17 applies a voltage Vcc in the erase, a voltage VPGMH in the write, and a voltage VREADH in the read to the gates of the transistors 59. As described above, Vcc>Vdda.

Note that each driver in the driver circuit 12 is commonly used for the plurality of interconnects. At this time, the voltages from the drivers are transferred to the plurality of interconnects via the current paths of the transistors 59. For example, the SGD driver 61-0 is commonly used for the plurality of signal lines SGD0 of a plurality of blocks BLK0, BLK1, . . . . The voltage output from the SGD driver 61-0 is transferred to the plurality of signal lines SGD0 via the transistor 59. In other words, the signal line SGD0 branches from the nodes between the transistor 59 and transistors 51. This also applies to the remaining interconnects.

This also applies to the BG driver 64, the CGDD driver 65, and the CGDS driver 66 although FIG. 20 does not illustrate them because of the limited space.

2. Erase Operation of Semiconductor Memory Device 1

The erase operation according to this embodiment will be explained next. In the operation according to this embodiment, after transistors 51, 53, 55 to 57 are cut off in the operation described in the first embodiment, the transistors 59 corresponding to them are cut off.

This operation will be explained with reference to FIG. 21 by exemplifying a select gate line SGDI0. FIG. 21 is a timing chart showing changes in a flag signal SG VCCFLAG, the output of the SGD driver 61-0, and the potentials of the signal line SGD0 and the select gate line SGDI0. This also applies to the other interconnects to be set in the floating state in the erase.

As shown in FIG. 21, the SGD driver 61-0 outputs a voltage Vss before, for example, time t1. Since, for example, the control circuit 17 applies the voltages Vcc and Vdda to the gates of the transistors 59 and 51-0, respectively, the transistors 59 and 51-0 are turned on. Hence, the potentials of the lines SGD0 and SGDI0 are Vss.

Assume that the flag signal SG_VCCFLAG changes to "H" level at time t1. In response to this, a transistor 112 is turned off, and a transistor 111 is turned on in the SGD driver 61-0. The potential of the output node of the SGD driver 61-0 thus rises toward Vcc, and the potentials of the lines SGD0 and SGDI0 also rise accordingly.

In the process of rise, when the potential of the signal line SGD0 reaches (Vdda-Vth) (Vth is the threshold voltage of the transistor 51-0), the transistor 51-0 is cut off, and the select gate line SGDI0 is set in an electrically floating state. The potential of the select gate line SGDI0 rises by coupling with a voltage VERA. This is the same as described in the first embodiment.

Next, when the potential of the output node of the SGD driver reaches (Vcc-Vth) (Vth is the threshold voltage of the transistor 59), the transistor 59 is cut off, and the signal line SGD0 is set in an electrically floating state. The potential of the signal line SGD0 rises by coupling with the voltage VERA.

3. Effects according to This Embodiment

The arrangement according to this embodiment can accurately set the potential of each interconnect at the time of erase. This effect will be described below.

The driver circuit 12 drives the plurality of blocks BLK. In this case, the interconnect capacitance (capacitance of signal lines SGD, SGS, BG, CGDD, and CGDS) that exists from the driver circuit 12 to the row decoder 11 may depend on the size or interconnect pattern of the chip. Hence, it is sometimes difficult to accurately and correctly set the potentials of the lines SGDI, SGSI, BGI, WLDD, WLDS including those interconnects by coupling.

In this embodiment, the switch 19 is provided between the driver circuit 12 and the row decoder 11 (in other words, between the driver circuit 12 and the signal lines SGD, SGS, BG, CGDD, and CGDS). The gate potentials (Vcc) of the transistors 59 in the switch 19 are set to be higher than the potential (Vdda) of a signal line TG. As a result, in the erase, when the driver circuit 12 generates the voltage Vcc in response to the flag signal, the transistors 51, 53, and 55 to 57 are cut off first, and the transistors 59 are cut off then in the row decoder 11. That is, the signal lines (SGDI, SGSI, WLDD, WLDS, and BGI) on the side of a memory cell array 10 are set in the floating state first, and the signal lines (SGD, SGS, CGDD, CGDS, and BG) on the driver side (peripheral circuit side) are set in the floating state next.

It is therefore possible to reduce the influence of the interconnect capacitance (signal lines SGD, SGS, BG, CGDD, and CGDS) that exists from the driver circuit 12 to the row decoder 11 on the rise of the potentials of the lines SGDI, SGSI, WLDD, WLDS, and BGI by coupling. In other words, the above-described uncertainties concerning the interconnect capacitance can be eliminated. This enables to accurately estimate the coupling amount between each signal line and the voltage VERA and precisely control the ultimate potentials of the signal lines SGD, SGS, CGDD, CGDS, and BG.

In this embodiment, the effect can be obtained even when the driver circuit 12 drives a single block, as a matter of course. However, when the driver circuit 12 drives a plurality of planes (a set of a plurality of blocks), a more remarkable effect can be obtained. This is because even if the interconnect length for the driver to the row decoder 11 is very long, charging the interconnects from the driver to the row decoder 11 need not taken into consideration. This allows to further speed up the erase operation.

[Modifications Etc.]

As described above, the semiconductor memory device 1 according to the embodiment includes first and second select transistors (ST1, ST2 in FIG. 2), a plurality of memory cells (MT, DTD, DTS in FIG. 2), word lines (WL, WLDD, WLDS in FIG. 2), select gate lines (SGDI, SGSI in FIG. 2), a driver circuit (Driver 12 in FIG. 18-10), first transfer transistors (Tr 50, 51, 53, 56, 57 in R/D 11 in FIG. 6), bit lines (BL in FIG. 2), a source line (SL in FIG. 2), and a detection circuit (Detector 16 in FIG. 1, 12). The memory cells (MT, DTD, DTS in FIG. 2) are stacked above a semiconductor substrate and have current paths connected in series between the first and second select transistors. Each memory cell includes a charge accumulation layer and a control gate. The word lines (WL, WLDD, WLDS in FIG. 2) are coupled to the gates of the memory cells. The select gate lines (SGDI, SGSI in FIG. 2) are coupled to the gates of the first and second select transistors. The driver circuit (Driver 12 in FIG. 18-10) outputs a first voltage (Vss or Vcc in FIG. 8-10). The first transfer transistors (Tr 50, 51, 53, 56, 57 in R/D 11 in FIG. 6) are associated with the word lines and the select gate lines to transfer the first voltage output from the driver circuit to the associated word lines and select gate lines. The bit lines (BL in FIG. 2) are connected to the memory cells via the current path of the first select transistor. The source line (SL in FIG. 2) is connected to the memory cells via the current path of the second select transistor. In data erase, the detection circuit (Detector 16 in FIG. 1, 12) detects a second voltage (VERA in FIG. 12) applied to the bit lines and/or the source line and generates a flag (SG_VCCFLAG, CGD_VCCFLAG in FIG. 12-13) in accordance with the detection result. The driver circuit changes the value of the first voltage (t1, t2: change to Vcc from Vss in FIG. 15) in response to generation of the flag to cut off the first transfer transistors.

According to this arrangement, the potentials of the interconnects are raised by coupling. This makes it possible to reduce the load on the voltage generation circuit 15 and reduce the power consumption of the semiconductor memory device 1.

Note that the embodiment is not limited to those described above, and various changes and modifications can be made. For example, in the above-described embodiment, each of the detection units 70 has the arrangement shown in FIG. 12 for the descriptive convenience. However, the detection units 70 may share the variable resistance unit 81, the decoder 83, and the switch portion 80. Only the comparator 84 may be provided for each detection unit 70.

In this case, for example, the nodes N1 to N3 may be used for the flags SG_VCCFLAG, CGD_VCCFLAG, and BG_VCCFLAG. More specifically, the comparator 84 of the first detection unit 70-1 is connected to the node N3 by the decoder 83 via the transistor 87c. The comparator 84 of the second detection unit 70-2 is connected to the node N2 by the decoder 83 via the transistor 87b. The comparator 84 of the third detection unit 70-3 is connected to the node Ni by the decoder 83 via the transistor 87a.

Alternatively, to set one of the lines SGDI, SGSI, WLDD, WLDS, and BGI in the floating state from the beginning in the erase operation, the transistor 87d may apply the voltage Vdda to the comparator 84 of the corresponding detection unit 70. When Vdda>Vref, the flag signal is set at "H" level from the first stage of the erase operation.

To implement the detection circuit 16, adding the decoder 83 and the comparator 84 suffices. That is, as the variable resistance unit 81, a resistive element to be used to discharge the voltage VERA is usable. In addition, a conventional switch may be used as the switch unit 80. Hence, the increase in the area upon implementing the detection circuit 16 is very small.

The decoder 83 is not indispensable. That is, if the optimum nodes N1 to N3 can be determined for each detection unit 70 at the time of manufacture, the switch unit 80 and the decoder 83 may be removed to directly connect the nodes N1 to N3 to the comparator 84.

However, it is difficult to determine the optimum nodes N1 to N3 for each detection unit 70. To control to obtain an optimum potential at time t4 in FIG. 19, the optimum nodes N1 to N3 are preferably determined while selecting the nodes N1 to N3 and feeding back the result. In this case, the decoder 83 is necessary. As for the choice of the transistors 87a to 87d, for example, the control circuit 17 gives an instruction to the decoder 83.

The arrangement shown in FIG. 6 has been described by exemplifying a case in which the first detection unit 70-1 is provided commonly for the SGD drivers 61 and the SGS drivers 62. However, the detection units 70 may separately be provided for the SGD drivers 61 and the SGS drivers 62. This also applies to the second detection unit 70-2. The detection units 70 may separately be provided for the SGD drivers 61-0 to 61-3 and the SGS drivers 62-0 to 62-3.

In the arrangement of the detection unit 70 shown in FIG. 12, the variable resistance unit 81 may include four or more resistive elements. The more the resistive elements are provided, the more accurately the flag signal generation timing can be set.

The memory cell array shown in FIG. 2 may have an arrangement as shown in FIG. 22. FIG. 22 is a circuit diagram of the block BLK0. The remaining blocks BLK1 to BLK3 can have the same arrangement. As shown in FIG. 22, the source-side dummy word line WLDS, the word lines WL0 to WL3, the backgate line BGI0, the even-numbered select gate lines SGDI0 and SGDI2, and the odd-numbered select gate lines SGSI1 and SGSI3 are led to one end side of the memory cell array 10. On the other hand, the drain-side dummy word line WLDD, the word lines WL4 to WL7, the even-numbered select gate lines SGSI0 and SGSI2, and the odd-numbered select gate lines SGDI1 and SGDI3 are led to the other end side of the memory cell array opposite to the one end side. This arrangement may be adopted. In this arrangement, for example, the row decoder 11 may be divided into two row decoders. The row decoders may be arranged on both sides of the memory cell array 10 so as to face each other. One row decoder may select the select gate lines SGDI0, SGDI2, SGSI1, and SGSI3, the word lines WL0 to WL3, the dummy word line WLDS, and the backgate line BGI0. The other row decoder may select the select gate lines SGSI0, SGSI2, SGDI1, and SGDI3, the word lines WL4 to WL7, and the dummy word line WLDD. According to this arrangement, the congestion of interconnects in the region between the driver circuit 12 and the memory cell array 10 (including the row decoder 11) can be relaxed.

In the above-described embodiment, a 3D-stacked NAND flash memory has been exemplified as the semiconductor memory device. However, the 3D-stacked NAND flash memory need not always have the arrangement shown in FIGS. 3 to 5. For example, the semiconductor layer 26 need not have the U-shape and may have the shape of a single column. In this case, the transistor BT is unnecessary. The embodiment is applicable not only to the 3D-stacked type but also to, for example, a conventional NAND flash memory including memory cells two-dimensionally arrayed in the plane of a semiconductor substrate. In the embodiment, erasing data in each block BLK has been exemplified. However, the embodiment is not limited to this. Data may be erased in, for example, each group of a plurality of NAND strings 18.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first select transistor and a second select transistor;
a plurality of memory cells stacked above a semiconductor substrate and electrically connected in series between the first select transistor and the second select transistor;
word lines electrically connected to the control gates of the memory cells;
select gate lines electrically connected to gates of the first select transistor and the second select transistor;
a driver circuit configured to output a first voltage;
first transfer transistors electrically connected to the word lines and the select gate lines, the first transfer transistors being electrically connected to the driver circuit;
bit lines electrically connected to the memory cells;
a source line electrically connected to the memory cells; and
a detection circuit configured to detect a second voltage applied to the bit lines and/or the source line and output a flag,
wherein the driver circuit changes a value of the first voltage in response to the flag.

2. The device according to claim 1, wherein a detection level of the detection circuit is configurable to a plurality of levels, and
a timing of the cut off differs between the first transfer transistors electrically connected to the word lines and the first transfer transistors electrically connected to associated with the select gate lines.

3. The device according to claim 2, further comprising second transfer transistors electrically connected to the word lines and the select gate lines, the second transfer transistors being electrically connected to the driver circuit,
wherein the driver circuit changes the value of the first voltage in response to the flag to cut off the first transfer transistors electrically connected to the select gate lines and then cut off the second transfer transistors.

4. The device according to claim 3, wherein in the first transfer transistors electrically connected to the word lines, the first transfer transistors electrically connected to word lines adjacent to the first select transistor and the second select transistor are cut off.

5. The device according to claim 1, wherein the memory cells include:
two first memory cells adjacent to the first select transistor and the second select transistor, and
a plurality of second memory cells electrically connected in series between the first memory cells,
the word lines include:
first word lines electrically connected to the control gates of the first memory cells; and
second word lines electrically connected to the control gates of the second memory cells, and
in the erase, first transfer transistors electrically connected to the first word lines are cut off by the driver circuit, and first transfer transistors electrically connected to the second word lines maintain an on state.

6. The device according to claim 5, wherein the first memory cells are dummy memory cells.

7. The device according to claim 5, wherein in the erase, first transfer transistors electrically connected to the first word lines are cut off after first transfer transistors electrically connected to the select gate lines are cut off 8. The device according to claim 5, wherein the driver circuit includes:
first drivers electrically connected to the first word lines; and
second drivers electrically connected to the select gate lines,
each of the first drivers and the second drivers comprising:
a first switch configured to output as the first voltage; and
a second switch configured to output a second voltage higher than the first voltage, and
when the flag is output, the first switch or the second switch opens.

9. The device according to claim 8, wherein when the second voltage is output, the first transfer transistors are cut off.

10. The device according to claim 7, wherein the memory cells further include a third memory cell electrically connected in series between two of the second memory cells adjacent to each other,
the device further includes:
a backgate line electrically coupled to a control gate of the third memory cell; and
a third transfer transistor electrically connected to the back gate line to apply the first voltage, and
the driver circuit changes the value of the first voltage in response to the flag to further cut off the third transfer transistor.

11. The device according to claim 10, wherein in the erase, the third transfer transistor is cut off after the first transfer transistors electrically connected to the first word lines are cut off.

12. A method for reading data of semiconductor memory device including a first select transistor, a second select transistor, and a plurality of memory cell transistors electrically connected in series between the first and second select transistors, the memory cell transistors being stacked above a semiconductor substrate, the method comprising:
applying an erase voltage to bit lines or a source line in data erase;
outputting a first flag in response to the erase voltage reaching to a first potential; and outputting a second flag in response to the erase voltage reaching to a second potential, wherein when the first flag is output, select gate lines electrically connected to gates of the first select transistor and the second select transistor are set in an electrically floating state, and when the second flag is output, a first word line electrically connected to gate of first one of the memory cell transistors is set in an electrically floating state.

13. The method according to claim 12, wherein the first word line is adjacent to one of the select gate lines.

14. The method according to claim 12, wherein a dummy memory cell is electrically connected to the first word line.

15. The method according to claim 12, further comprising:

in response to output of the first flag, cutting off first transfer transistors configured to transfer a voltage to the select gate lines; and in response to output of the second flag, cutting off a second transfer transistor configured to transfer a voltage to the first word line.

16. The method according to claim 15, wherein the first select transistors and the second select transistor are cut off by raising a voltage of one of a source and a drain while maintaining a gate voltage.

17. The method according to claim 12, wherein the second flag is output after the first flag is output.

* * * * *